United States Patent
Lee et al.

(10) Patent No.: US 10,607,965 B2
(45) Date of Patent: Mar. 31, 2020

(54) STACKED SEMICONDUCTOR DEVICE, SYSTEM INCLUDING THE SAME AND METHOD OF TRANSFERRING SIGNALS IN THE SAME

(71) Applicant: Samsung Electronics Co., Ltd., Suwon-si, Gyeonggi-do (KR)

(72) Inventors: Haesuk Lee, Seongnam-si (KR); So-Young Kim, Hwaseong-si (KR); Seung-Han Woo, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 16/044,886

(22) Filed: Jul. 25, 2018

(65) Prior Publication Data

US 2019/0096853 A1  Mar. 28, 2019

(30) Foreign Application Priority Data

Sep. 28, 2017  (KR) .................. 10-2017-0126045

(51) Int. Cl.
| | |
|---|---|
| *H01L 25/065* | (2006.01) |
| *H01L 23/538* | (2006.01) |
| *G11C 5/02* | (2006.01) |
| *G11C 5/06* | (2006.01) |

(52) U.S. Cl.
CPC .......... *H01L 25/0657* (2013.01); *G11C 5/025* (2013.01); *G11C 5/063* (2013.01);
(Continued)

(58) Field of Classification Search
CPC ............. H01L 25/0657; H01L 23/5384; H01L 2224/16145; H01L 2224/16227;
(Continued)

(56) References Cited

U.S. PATENT DOCUMENTS

| | | |
|---|---|---|
| 7,834,450 B2 | 11/2010 | Kang |
| 8,441,831 B2 | 5/2013 | Ku et al. |

(Continued)

FOREIGN PATENT DOCUMENTS

FR  2946182 A1  12/2010

OTHER PUBLICATIONS

Invitation to Respond to Written Opinion, SG Application No. 10201808065X, dated Jul. 22, 2019, 4 pp.

*Primary Examiner* — Henry Tsai
*Assistant Examiner* — John B Roche
(74) *Attorney, Agent, or Firm* — Myers Bigel, P.A.

(57) ABSTRACT

A stacked semiconductor device includes a plurality of semiconductor dies stacked in a first direction, M data paths electrically connecting the plurality of semiconductor dies, one data path including one or more through-silicon vias, where M is a positive integer, a transmission circuit including M serialization units configured to serialize P transmission signals to M serial signals and output the M serial signals to the M data paths, respectively, where P is a positive integer greater than M and a reception circuit including M parallelization units configured to receive the M serial signals from the M data paths and parallelize the M serial signals to P reception signals corresponding to the P transmission signals. The number of the through-silicon vias is reduced by serializing the transmission signals, transferring the serialized signals through the smaller number of data paths between the stacked semiconductor dies and then parallelizing the transferred signals.

19 Claims, 26 Drawing Sheets

(52) U.S. Cl.
CPC .............. *H01L 23/5384* (2013.01); *H01L 2224/16145* (2013.01); *H01L 2224/16227* (2013.01); *H01L 2225/06513* (2013.01); *H01L 2225/06517* (2013.01); *H01L 2225/06541* (2013.01); *H01L 2225/06565* (2013.01); *H01L 2924/15192* (2013.01)

(58) Field of Classification Search
CPC . H01L 2224/06513; H01L 2224/06517; H01L 2224/06541; H01L 2224/06565; H01L 2924/15192; G11C 5/025; G11C 5/063
See application file for complete search history.

(56) References Cited

U.S. PATENT DOCUMENTS

| | | |
|---|---|---|
| 8,890,607 B2 | 11/2014 | Huang et al. |
| 8,922,237 B2 | 12/2014 | Ku |
| 8,988,130 B2* | 3/2015 | Kim .................. H01L 25/0657 |
| | | 257/621 |
| 9,030,024 B2 | 5/2015 | Kim |
| 9,287,239 B2 | 3/2016 | Ware et al. |
| 9,304,167 B2 | 4/2016 | Hwang et al. |
| 9,620,194 B1* | 4/2017 | Lee .................... G11C 7/1039 |
| 2009/0039492 A1* | 2/2009 | Kang .................... G11C 5/02 |
| | | 257/686 |
| 2011/0057819 A1 | 3/2011 | Ide et al. |
| 2014/0003168 A1 | 1/2014 | Lee et al. |
| 2015/0019803 A1* | 1/2015 | Miller .................. G06F 3/0611 |
| | | 711/105 |

* cited by examiner

STACKED SEMICONDUCTOR DEVICE, SYSTEM INCLUDING THE SAME AND METHOD OF TRANSFERRING SIGNALS IN THE SAME

CROSS-REFERENCE TO RELATED APPLICATION

This U.S. non-provisional application claims priority under 35 USC § 119 to Korean Patent Application No. 10-2017-0126045, filed on Sep. 28, 2017, in the Korean Intellectual Property Office (KIPO), the disclosure of which is herein incorporated in its entirety by reference.

BACKGROUND

Example embodiments relate generally to semiconductor integrated circuits, and more particularly to a stacked semiconductor device, a system including a stacked semiconductor device and a method of transferring signals in a stacked semiconductor device.

Multiple circuits are integrated in a limited area for high capacity, miniaturization of circuitry, high operation speed, etc. For example, memory capacity and the speed of main memory are increased by increasing speed of hardware and/or increasing complexity of software. A plurality of semiconductor dies may be stacked in a package of a memory chip to increase the memory capacity within the same area. Many through-silicon vias may be used to implement high-bandwidth signal transfer in the stacked structure. A large number of through-silicon vias in the semiconductor dies, however, may increase chip size.

SUMMARY

Some example embodiments provide a stacked semiconductor device and a system including a stacked semiconductor device capable of performing an efficient signal transfer between stacked semiconductor dies.

Some example embodiments may provide a method of transferring signals in a stacked semiconductor dies.

According to example embodiments, a stacked semiconductor device includes a plurality of semiconductor dies in the stacked semiconductor device stacked in a first direction, M data paths electrically connecting the plurality of semiconductor dies, one data path of the M data paths including one or more through-silicon vias, where M is a positive integer, a transmission circuit including M serialization units configured to serialize P transmission signals to M serial signals and output the M serial signals to the M data paths, respectively, where P is a positive integer greater than M, and a reception circuit including M parallelization units configured to receive the M serial signals from the M data paths and parallelize the M serial signals to P reception signals corresponding to the P transmission signals.

According to example embodiments, a system includes a base substrate, a plurality of semiconductor dies stacked on the base substrate in a first direction and a plurality of data paths electrically connecting the plurality of semiconductor dies, one data path of the plurality of data paths including one or more through-silicon vias. The system is configured to serialize a plurality of transmission signals to a plurality of serial signals to output the plurality of serial signals to the plurality of data paths, respectively, in a first semiconductor die among the plurality of semiconductor dies, the number of the transmission signals being greater than the number of the data paths, and the system is configured to parallelize the plurality of serial signals received from the plurality of data paths to a plurality of reception signals corresponding to the plurality of transmission signals in a second semiconductor die among the plurality of semiconductor dies.

According to example embodiments, a method of transferring signals in a stacked semiconductor device, includes, stacking a plurality of semiconductor dies in a first direction, electrically connecting the plurality of semiconductor dies through M data paths, at least one data path of the M data paths including a respective one of a through-silicon via, where M is a positive integer, serializing P transmission signals to M serial signals in a first semiconductor die among the plurality of semiconductor dies to output the M serial signals to the M data paths, respectively, where P is a positive integer greater than M and parallelizing the M serial signals received from the M data paths to P reception signals corresponding to the P transmission signals in a second semiconductor die among the plurality of semiconductor dies.

The stacked semiconductor device, the system and the method of transferring signals according to example embodiments may reduce the sizes of the stacked semiconductor device and the system by serializing the transmission signals, transferring the serialized signals through the smaller number of data paths between the stacked semiconductor dies and then parallelizing the transferred signals, to reduce the number of through-silicon vias.

BRIEF DESCRIPTION OF THE DRAWINGS

Example embodiments of the present disclosure will be more clearly understood from the following detailed description taken in conjunction with the accompanying drawings.

DETAILED DESCRIPTION OF THE EMBODIMENTS

Figure 1:
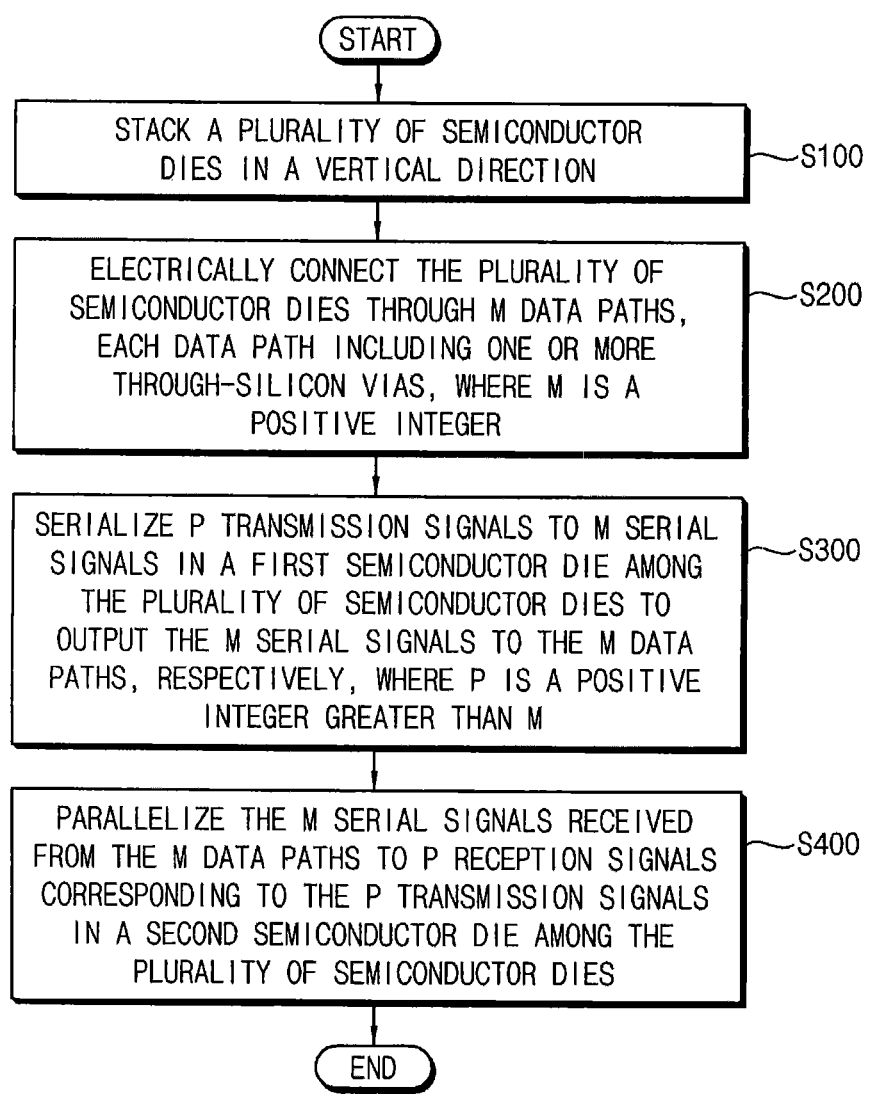
FIG. 1 is a flow chart illustrating a method of transferring signals in a stacked semiconductor device, according to some embodiments of the present inventive concept.

It is noted that aspects of the inventive concept described with respect to one embodiment, may be incorporated in a different embodiment although not specifically described relative thereto. That is, all embodiments and/or features of any embodiment can be combined in any way and/or combination. These and other objects and/or aspects of the present inventive concept are explained in detail in the specification set forth below.

Various example embodiments will be described more fully hereinafter with reference to the accompanying drawings, in which some example embodiments are shown. In the drawings, like numerals refer to like elements throughout. The repeated descriptions may be omitted.

FIG. 1 is a flow chart illustrating a method of transferring signals in a stacked semiconductor device according to some embodiments.

Referring to FIG. 1, a plurality of semiconductor dies are stacked in a first direction, such as a vertical direction (S100), and the plurality of semiconductor dies are electrically connected through M data paths, where each data path includes one or more through-silicon vias and M is a positive integer (S200). The stacking and electrically connecting of the plurality of semiconductor dies will be described below with reference to FIGS. 2 and 3.

A number P transmission signals are serialized to M serial signals in a first semiconductor die among the plurality of semiconductor dies to output the M serial signals to the M data paths, respectively, where P is a positive integer greater than M (S300). The M serial signals received from the M data paths are parallelized to P reception signals corresponding to the P transmission signals in a second semiconductor die among the plurality of semiconductor dies (S400). The transfer of the P transmission signals through the M data paths will be described below with reference to FIGS. 4, 5 and 6.

In a typical stacked semiconductor device, each semiconductor die transmits or receives a signal to or from another semiconductor die through a single data path including through-silicon vias. Such through-silicon vias may increase a chip size due to the space requirements and/or clearance requirements of the through-silicon vias.

The stacked semiconductor device, the system and the method of transferring signals according to example embodiments may reduce the sizes of the stacked semiconductor device and the system by serializing the transmission signals, transferring the serialized signals through a smaller number of data paths between the stacked semiconductor dies and then parallelizing the transferred signals, thus reducing the number of through-silicon vias.

FIGS. 2 through 6 are diagrams illustrating a stacked semiconductor device according to example embodiments.

Figure 2:
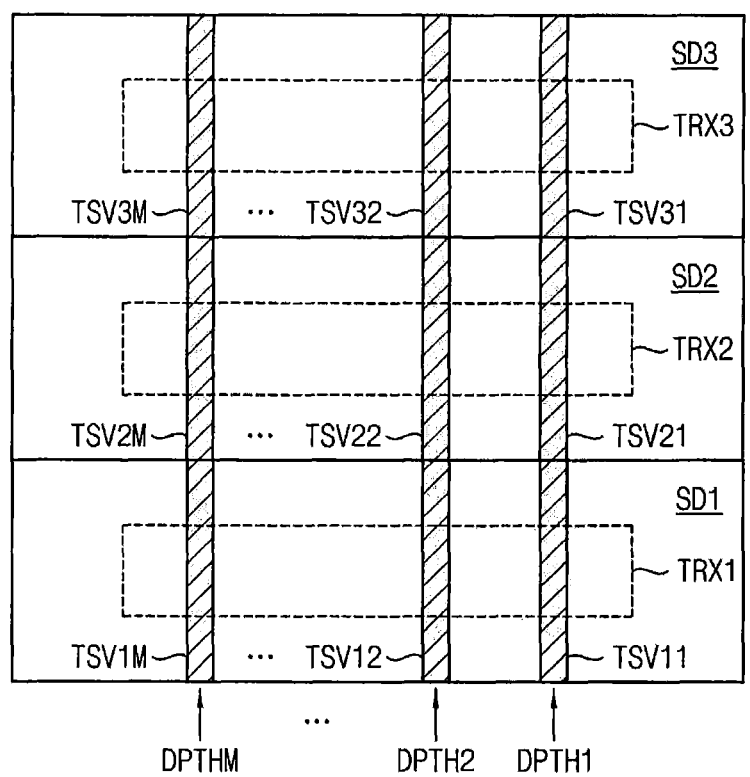
FIGS. 2 through 6 are diagrams illustrating a stacked semiconductor device, according to some embodiments of the present inventive concept.
Figure 3:
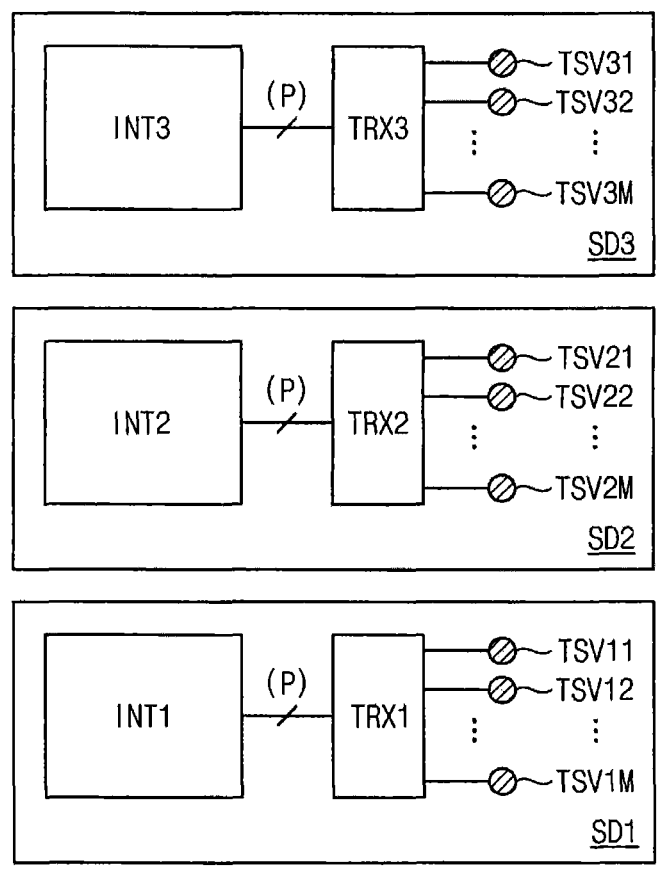
Figure 4:
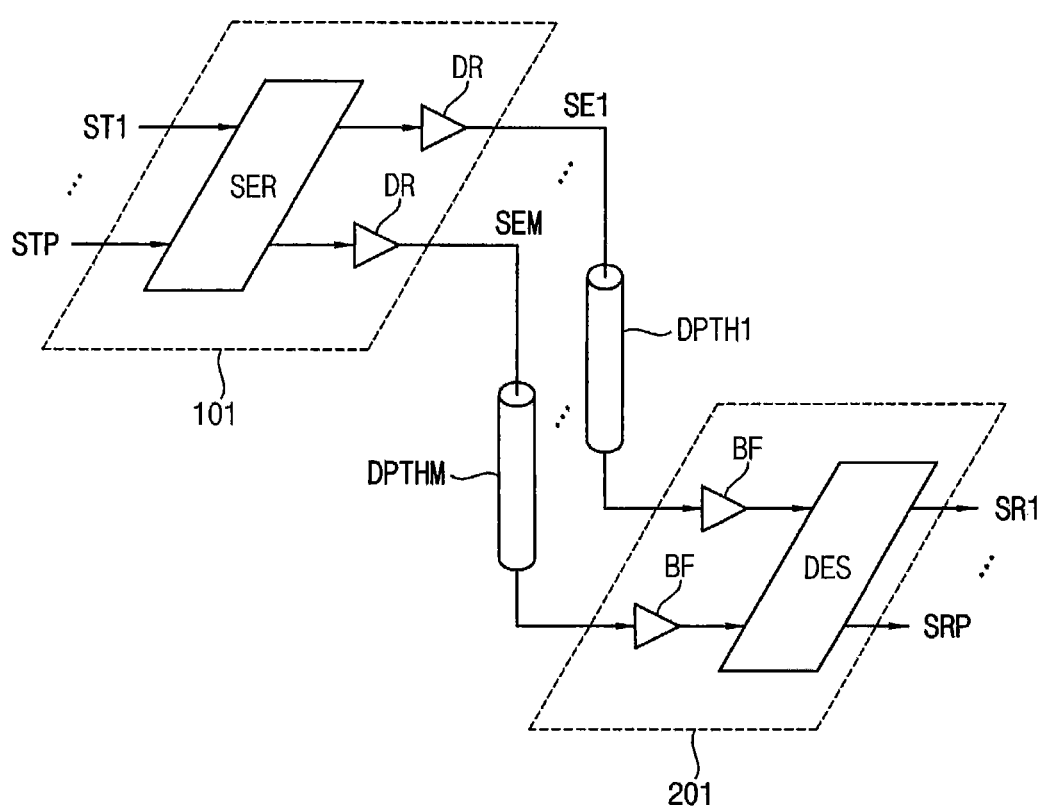

FIGS. 2 and 3 illustrate a stack structure of a stacked semiconductor device and FIG. 4 illustrates a configuration for signal transfer included in a stacked semiconductor device.

Referring to FIGS. 2 and 3, a stacked semiconductor device 10 includes a plurality of semiconductor dies SD1, SD2 and/or SD3 that are stacked in a first direction such as a vertical direction. FIG. 2 illustrates an example vertical structure in a stacked state of the semiconductor dies SD1, SD2 and/or SD3, and FIG. 3 illustrates an example horizontal structure in a non-stacked state of the semiconductor dies SD1, SD2 and/or SD3. FIGS. 2 and 3 illustrate non-limiting examples of the three stacked semiconductor dies SD1, SD2 and SD3, and the number of the stacked semiconductor dies may vary. As a non-limiting example, the stacking of the semiconductor dies of FIG. 2 may be such that the semiconductor dies SD1, SD2, and SD3 are stacked vertically such that the largest faces of the semiconductor dies SD1, SD2, and SD3 face one another.

The semiconductor dies SD1, SD2 and SD3 may include internal circuits INT1, INT2 and INT3, transceiver circuits TRX1, TRX2 and TRX3 and through-silicon vias or through-substrate vias TSV11, TSV12, TSV21, TSV22, TSV31 and/or TSV32, respectively. The numbers of the through-substrate vias included in each semiconductor die may vary.

Each of data paths DPTH1~DPTHM may include one or more through-substrate vias that are formed in the semiconductor dies SD1, SD2 and SD3, respectively. For example, as illustrated in FIG. 2, the first data path DPTH1 may include the three through-substrate vias TSV11, TSV21 and TSV31 respectively formed in the three semiconductor dies SD1, SD2 and SD3, and the second data path DPTH2 may include the three through-substrate vias TSV21, TSV22 and TSV32 respectively formed in the three semiconductor dies SD1, SD2 and SD3. Even though FIG. 2 illustrates that the two through-substrate vias in the adjacent semiconductor dies are connected directly, the through-substrate vias may be electrically connected through bumps, pads, metal wires, etc.

Each transceiver circuit TRXi (i=, 1, 2, 3) may receive P transmission signals from the internal circuit INTi and serialize the P transmission signals to M serial signals to be transmitted to the M data paths DPTH1~DPTHM. In addition, each transceiver circuit TRXi may receive M serial signals from the M data paths DPTH1~DPTHM and parallelize the M serial signals to P reception signals to provide the P reception signals to each transceiver circuit TRXi. Such signal transfer will be further described below with reference to FIGS. 4 through 21.

The internal circuit INTi may include various integrated circuits according to the kind of the stacked semiconductor device 10. For example, if the stacked semiconductor device 10 is a memory device, memory cells and circuits for operating the memory cells may be integrated in the internal circuit INTi. The semiconductor dies SD1, SD2 and SD3 may be homogeneous or heterogeneous.

Referring to FIG. 4, a stacked semiconductor device 11 includes a transmission circuit 101, first through M-th data paths DPTH1~DPTHM and a reception circuit 201. The transmission circuit 101 and the reception circuit 201 may be included in the transceiver circuits TRX1, TRX2 and TRX3 in FIGS. 2 and 3, respectively. For example, to perform an interlayer signal transfer, the transmission circuit 101 may be included in one of the semiconductor dies SD1, SD2 and SD3 and the reception circuit 201 may be included in another of the semiconductor dies SD1, SD2 and SD3. As described above with reference to FIGS. 2 and 3, each of the first through M-th path1 DPTH1~DPTHM may include at least one through-substrate via for the signal transfer between the semiconductor dies SD1, SD2 and SD3.

The transmission circuit 101 may include a serialization circuit SER and drivers DR. The serialization circuit SER may serialize the P transmission signals ST1~STP to M serial signals SE1~SEM to be output to the M data paths DPTH1~DPTHM. As will be described below with reference to FIGS. 5 and 6, the serialization circuit may include a plurality of serialization units.

The reception circuit 201 may include reception buffers BF and a deserialization circuit or a parallelization circuit DES. The parallelization circuit DES may parallelize the M serial signals SE1~SEM received from the M data paths DPTH1~DPTHM to generate the P reception signals SR1~SRP corresponding to the P transmission signals ST1~STP, respectively. As will be described below with reference to FIGS. 5 and 6, the parallelization circuit may include a plurality of parallelization units.

The drivers DR may be omitted or included in the serialization circuit SER. In addition, the reception buffers BF may be omitted or included in the parallelization circuit DES. Even though the M serial signals SE1~SEM may be reinforced, attenuated or distorted through the drivers DR, the M data paths DPTH1~DPTHM and/or the reception buffers BF, it is assumed for convenience of description that the M serial signals SE1~SEM output from the serialization circuit SER are the same as those received by the parallelization circuit DES. In some embodiments, M<P, thus reducing the number of data paths.

As such, the stacked semiconductor device according to example embodiments may reduce the sizes of the stacked semiconductor device by serializing the transmission signals, transferring the serialized signals through the smaller number of data paths between the stacked semiconductor dies and then parallelizing the transferred signals, to reduce the number of through-silicon vias.

Figure 5:
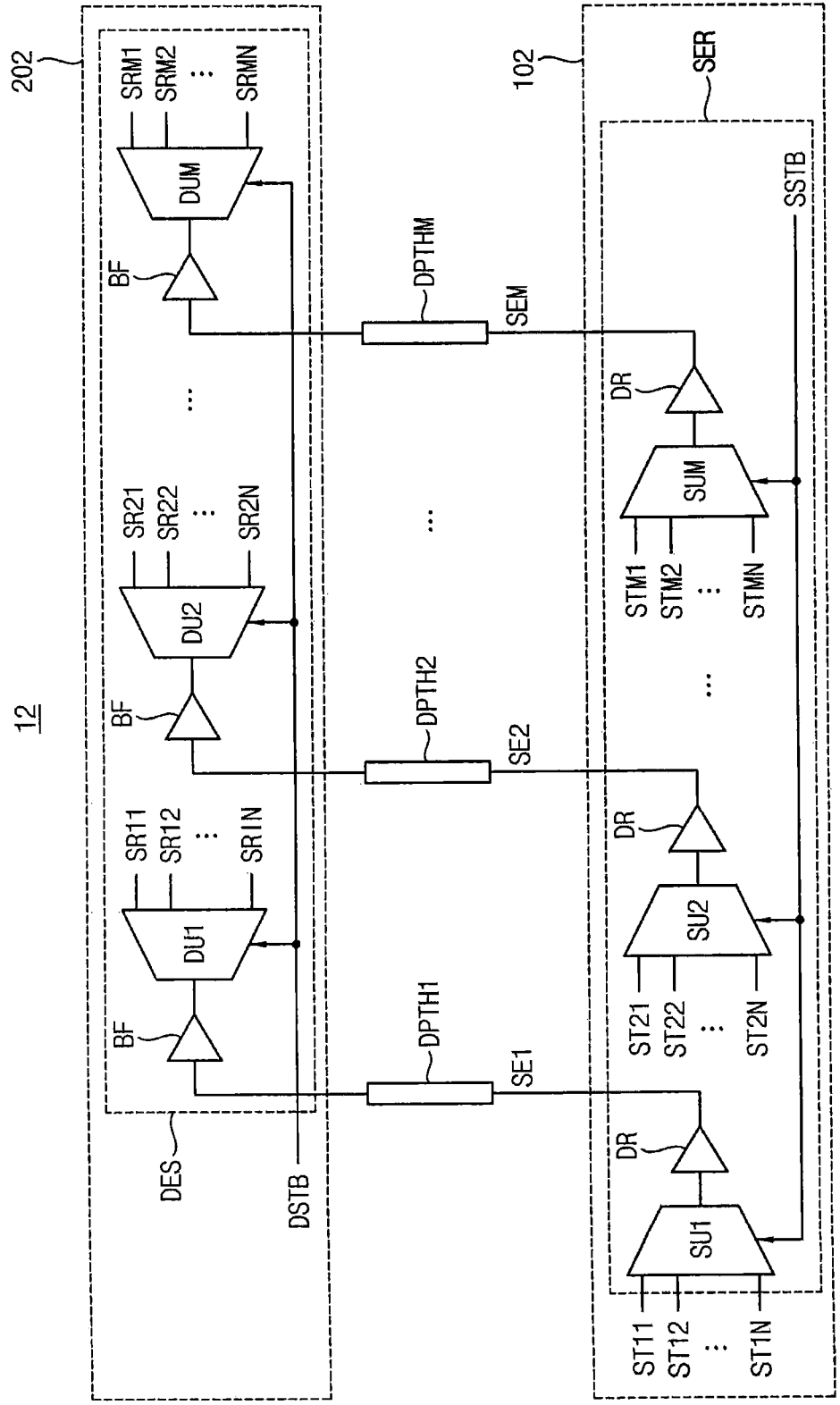
Figure 6:
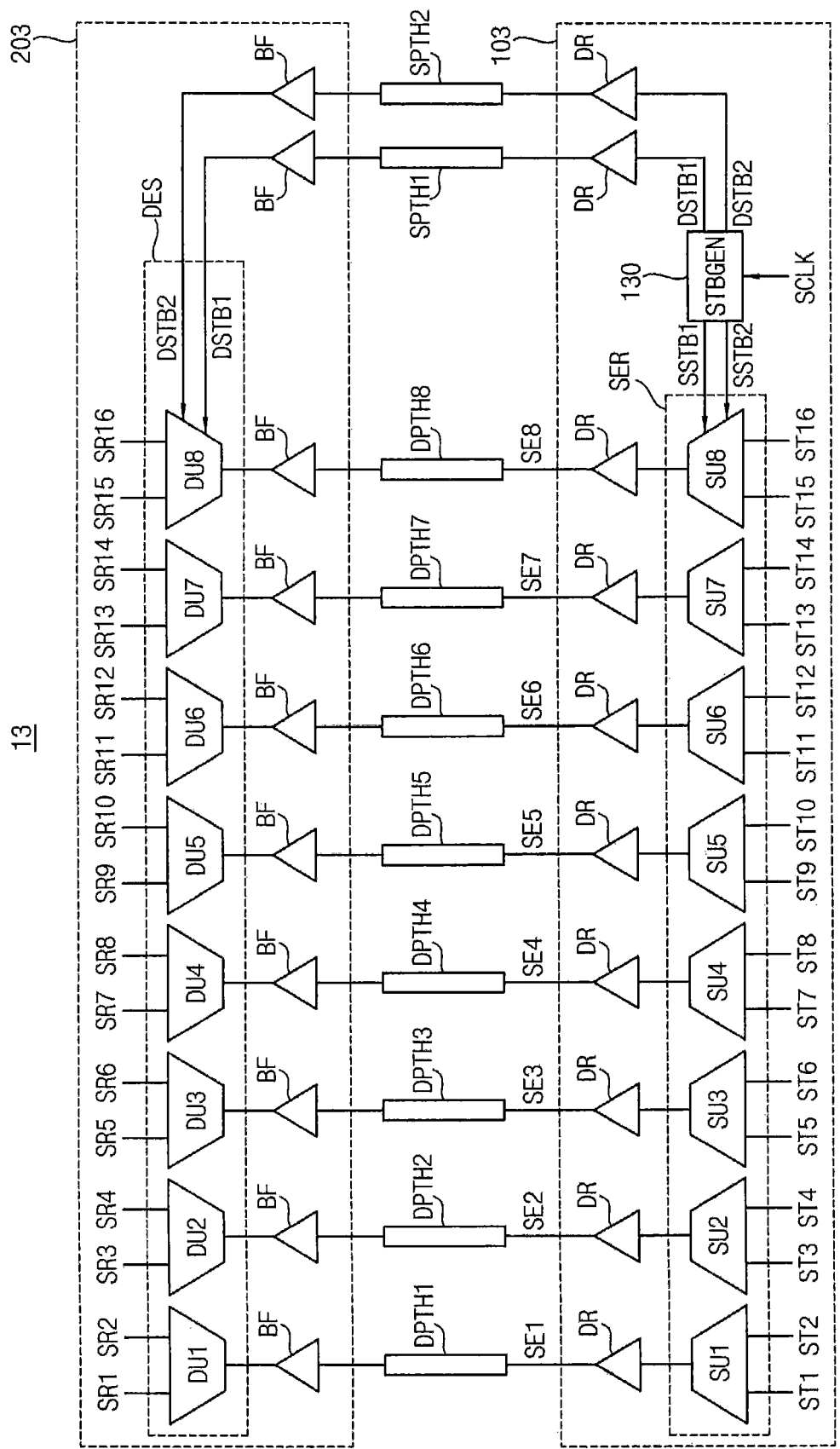

FIG. 5 is a diagram illustrating a stacked semiconductor device according to example embodiments and FIG. 6 is a circuit diagram illustrating an example embodiment of the stacked memory device of FIG. 5.

Referring to FIG. 5, a stacked semiconductor device 12 includes a transmission circuit 102, first through M-th data paths DPTH1~DPTHM and a reception circuit 202. The transmission circuit 102 and the reception circuit 202 may be included in the transceiver circuits TRX1, TRX2 and TRX3 in FIGS. 2 and 3, respectively.

A serialization circuit SER of the transmission circuit 102 may include M serialization units SU1~SUM, and a parallelization circuit DES of the reception circuit 202 may include M parallelization units DUMDUM. Each of the M serialization units SU1~SUM may serialize N transmission signals among the P transmission signals ST11~STMN to generate each of the M serial signals SE1~SEM. Each of the M parallelization units DU1~DUM may parallelize each of the M serial signals SE1~SEM to generate N reception signals among the P reception signals SR11~SRMN. In other words, the k-th serialization unit SUk (k=1~M) serializes the N transmission signals STk1~STkN to generate the k-th serial signal SEk and the k-th parallelization unit DUk parallelizes the k-th serial signal SEk received through the k-th data path DPTHk to generate the N reception signals SRk1~SRkN corresponding to the N transmission signals STk1~STkN.

In conventional stacked semiconductor dies, M*N (=P) data paths are used to transfer M*N data signals. Thus M*N through-silicon vias must be formed in each semiconductor die and the large number of the through-silicon vias become one factor increasing the size of the stacked semiconductor device. In contrast, in the stacked semiconductor device 12 according to example embodiments, the M*N data signals may be transferred between the stacked semiconductor dies using the M data paths. As such, the sized of the stacked semiconductor device and the system including the stacked semiconductor device may be reduced by reducing the number of the through-silicon vias.

Referring to FIG. 6, a stacked semiconductor device 13 includes a transmission circuit 103, first through eighth data paths DPTH1~DPTH8 and a reception circuit 203. As described above, the transmission circuit 103 and the reception circuit 203 may be included in the transceiver circuits TRX1, TRX2 and TRX3 in FIGS. 2 and 3, respectively.

A serialization circuit SER of the transmission circuit 103 may include eight serialization units SU1~SU8, and a parallelization circuit DES of the reception circuit 203 may include eight parallelization units DU1~DU8. Each of the eight serialization units SU1~SU8 may serialize two transmission signals among the sixteen transmission signals ST1~ST16 to generate each of the eight serial signals SE1~SE8. Each of the eight parallelization units DU1~DU8 may parallelize each of the eight serial signals SE1~SE8 to generate two reception signals among the sixteen reception signals SR1~SR16 corresponding to the sixteen transmission signals ST1~ST16.

In comparison with the stacked semiconductor device 12 of FIG. 5, the stacked semiconductor device 13 of FIG. 6 further includes one or more strobe paths SPTH1 and SPTH2. The strobe paths SPTH1 and/or SPTH2 may electrically connect the stacked semiconductor dies and each of the strobe paths SPTH1 and SPTH2 may include one or more through-silicon vias, as the above-described data paths.

In some example embodiments, as illustrated in FIG. 6, the transmission circuit 103 may further include a strobe generation circuit STBGEN 130 in addition to the serialization units SU1~SU8. The strobe generation circuit 130 may generate one or more parallelization strobe signals DSTB1 and DSTB2 and one or more serialization strobe signals SSTB1 and SSTB2 based on a source clock signal SCLK. The serialization units SU1~SU8 of the transmission circuit 103 may serialize the transmission signals ST1~ST16 in response to the one or more serialization strobe signals SSTB1 and SSTB2. The parallelization units DU1~DU8 of the reception circuit 203 may parallelize the serial signals SE1~SE8 to the reception signals SR1~SR16 in response to the one or more parallelization strobe signals DSTB1 and DSTB2 that are received through the through the one or more strobe paths SPTH1 and SPTH2.

In some embodiments, The parallelization strobe signals DSTB1 and DSTB2 and the serialization strobe signals SSTB1 and SSTB2 may be generated and provided from an external circuit of the semiconductor die including the transmission circuit 103.

The parallelization strobe signals DSTB1 and DSTB2 and the serialization strobe signals SSTB1 and SSTB2 may be synchronized with each other. For example, the parallelization strobe signals DSTB1 and DSTB2 and the serialization strobe signals SSTB1 and SSTB2 may be generated based on the same source clock signal SCLK. Here, "synchronization of two signals" may represent not necessarily that transition timings of the two signals must coincide, but that the transition timing of one signal is associated with the transition timing of the other signal depending on the relative transfer delay between the two signals.

FIG. 6 illustrates that the sixteen data signals are transferred using the eight data paths DPTH1~DPTH8. The configuration of FIG. 6 is a non-limiting example to describe a configuration and an operation of a stacked semiconductor device according to example embodiments. In other words, the values M=2, N=2 and P=M*N=16 in FIG. 6 may be changed in various embodiments. In addition, the numbers of the serialization strobe signals and the parallelization strobe signals may be determined depending on the configurations of the serialization units and the parallelization units. Even though FIGS. 5 and 6 illustrate that the same number of the transmission signals are serialized to each serial signal, a different numbers of the transmission signals may be serialized to the respective serial signals by different ones of serialization units SU1~SU8.

Figure 7:
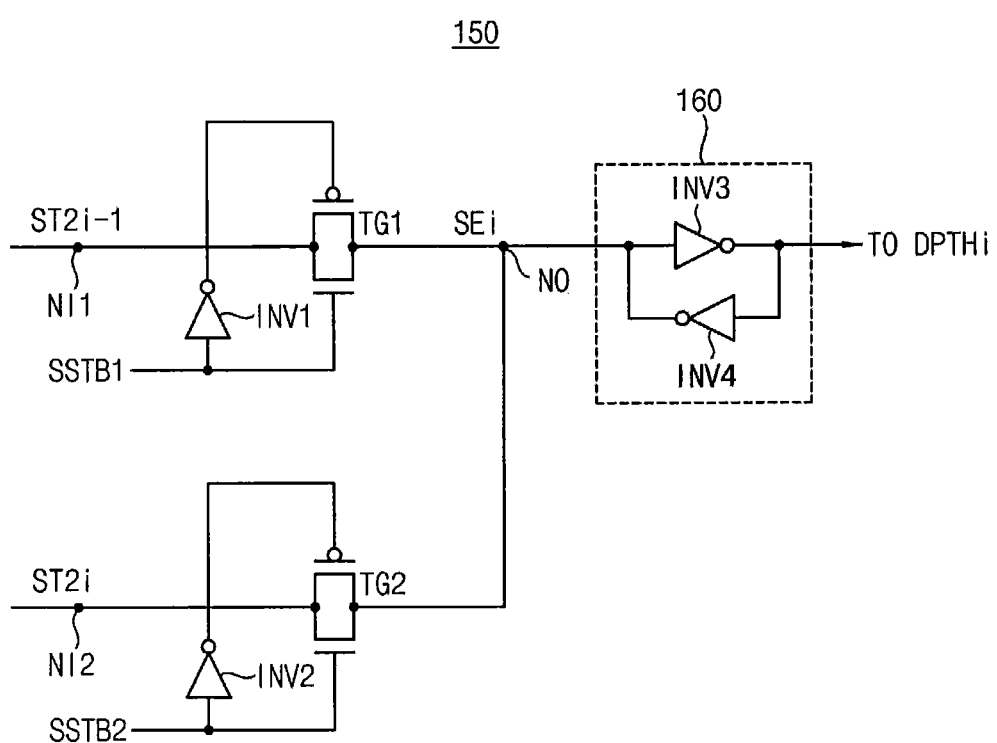
FIG. 7 is a circuit diagram illustrating an example embodiment of a serialization unit included in a transmission circuit of a stacked semiconductor device, according to some embodiments of the present inventive concept.
Figure 8:
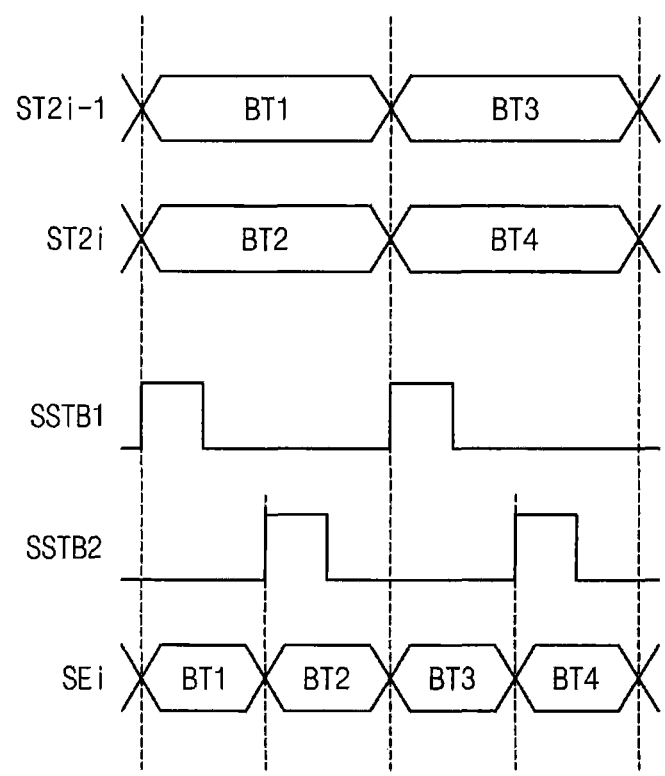
FIG. 8 is a timing diagram illustrating operation of the serialization unit of FIG. 7, according to some embodiments of the present inventive concept.

FIG. 7 is a circuit diagram illustrating an example embodiment of a serialization unit included in a transmission circuit of a stacked semiconductor device according to example embodiments, and FIG. 8 is a timing diagram illustrating an operation of the serialization unit of FIG. 7.

Referring to FIGS. 7 and 8, each serialization unit 150 included in the serialization circuit SER may include a first transmission gate TG1 and a second transmission gate TG2. The first transmission gate TG1 may be connected between a first input node NI1 receiving a first transmission signal ST2i-1 among the plurality of transmission signals and an output node NO connected to each data path DPTHi. The second transmission gate TG2 may be connected between a second input node NI2 receiving a second transmission signal ST2i among the plurality of transmission signals and the output node NO. Each serialization unit 150 may further include inverters INV1 and INV2 to invert the serialization strobe signals SSTB1 and SSTB2 and an output circuit 160 to buffer the serial signal SEi of the output node NO. For example, the output circuit 160 may be implemented with a latch of two inverters INV3 and INV4. The output circuit 160 may be the above-described driver DR or may be a portion of the driver DR.

The first transmission gate TG1 may be turned on during an activation time of the first serialization strobe signal SSTB1 and the second transmission gate TG2 may be turned on during an activation time of the second serialization strobe signal SSTB2 having a phase different from a phase of the first serialization strobe signal SSTB1. As illustrated in FIG. 8, The first and second serialization strobe signals SSTB1 and SSTB2 may be pulse signals having pulses of relatively short pulse widths.

The first and second serialization strobe signals SSTB1 and SSTB2 may be activated alternately and thus the first and second transmission gates TG1 and TG2 may transfer the first and second transmission signals ST2i-1 and ST2i alternately to the data path DPTHi. As a result, the serialization unit 150 may sample data bits BT1 and BT3 of the first transmission signal ST2i-1 and data bits BT2 and BT4 of the second transmission signal ST2i alternately to generate the serial signal SEi.

FIGS. 7 and 8 illustrate a non-limiting example of the serialization unit including the two transmission gates, and it would be understood easily that the serialization unit may include three or more transmission gates. According to example embodiments, each of the above-described M serialization units may include N transmission gates configured to alternately transfer N transmission signals among the P transmission signals to each of the M data paths in response to N serialization strobe signals having different phases, respectively. In other words, N transmission gates may be configured to transfer N transmission signals among the P transmission signals in a round-robin order to each of the M data paths. For example, a first transmission gate may transfer a first transmission signal, followed by a second transmission gate transferring a second transmission signal, followed by a third a first transmission gate may transferring a third transmission signal.

Figure 9:
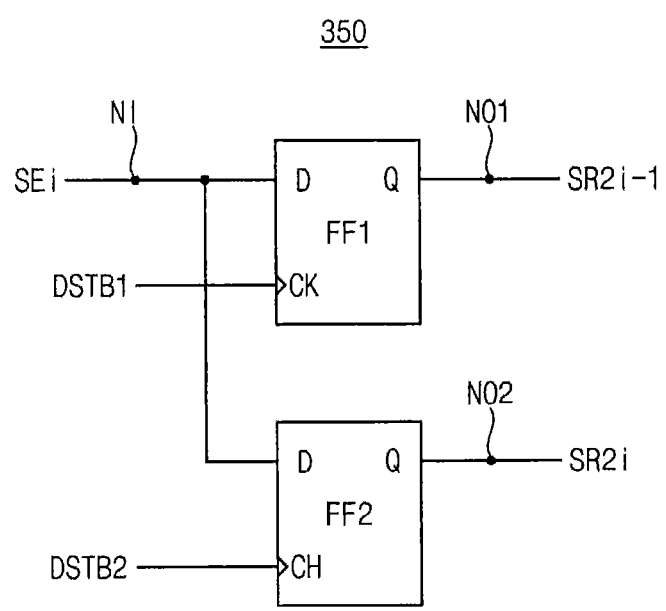
FIG. 9 is a circuit diagram illustrating an example embodiment of a parallelization unit included in a reception circuit of a stacked semiconductor device, according to some embodiments of the present inventive concept.
Figure 10:
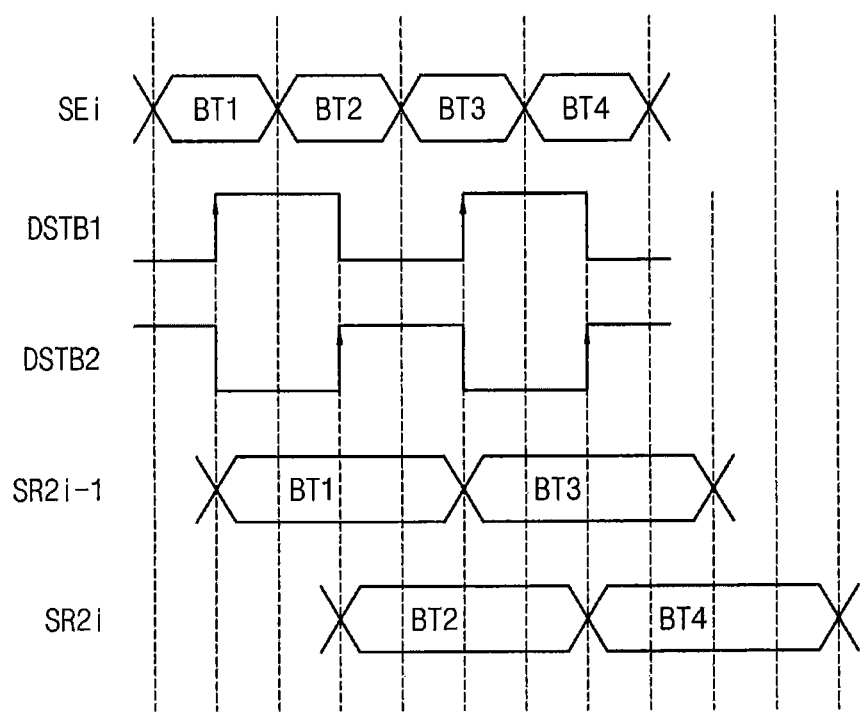
FIG. 10 is a timing diagram illustrating an operation of the parallelization unit of FIG. 9.

FIG. 9 is a circuit diagram illustrating an example embodiment of a parallelization unit included in a reception circuit of a stacked semiconductor device according to example embodiments, and FIG. 10 is a timing diagram illustrating an operation of the parallelization unit of FIG. 9.

Referring to FIGS. 9 and 10, each parallelization unit 350 included in the parallelization circuit DES of FIG. 6 may include a first flip-flop FF1 and a second flip-flop FF2. The first flip-flop FF1 may include a data terminal D connected to an input node NI receiving each serial signal SEi among the plurality of serial signals, a clock terminal CK receiving a first parallelization strobe signal DSTB1 and an output terminal Q connected to a first output node NO1 generating a first reception signal SR2i-1 among the plurality of reception signals. The second flip-flop FF2 may include a data terminal D connected to the input node NI receiving the each serial signal SEi, a clock terminal CK receiving a second parallelization strobe signal DSTB2 having a phase different from a phase of the first parallelization strobe signal DSTB1 and an output terminal Q connected to a second output node NO2 generating a second reception signal SR2i among the plurality of reception signals. As illustrated in FIG. 10, the first and second parallelization strobe signals DSTB1 and DSTB2 may have duty ratios of about 0.5.

In some example embodiments, the first and second flip-flops FF1 and FF2 may be implemented with rising edge triggered flip-flops. In this case, as illustrated in FIG. 10, data bits BT1, BT2, BT3 and BT4 of the serial signal SEi may be sampled alternately in synchronization with the rising edges of the first and second parallelization strobe signals DSTB1 and DSTB2. As a result, the data bits BT1 and BT3 may be sampled by the first parallelization strobe signal DSTB1 to be provided as the first reception signal SR2i-1 and the data bits BT2 and BT4 may be sampled by the second parallelization strobe signal DSTB2 to be provided as the second reception signal SR2i.

FIGS. 9 and 10 illustrate a non-limiting example of the parallelization unit including the two flip-flops, and it would be understood easily that the parallelization unit may include three or more flip-flops. According to example embodiments, each of the above-described M parallelization units may include N flip-flops configured to sample each of the M serial signals in response to N parallelization strobe signals having different phases, respectively, to generate N reception signals among the P reception signals.

Figure 11:
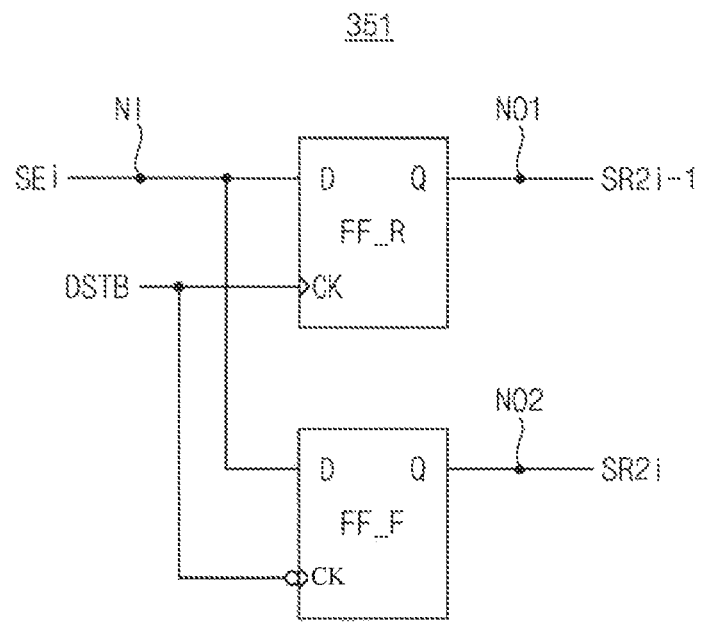
FIG. 11 is a circuit diagram illustrating an example embodiment of a parallelization unit included in a receiving circuit of a stacked semiconductor device, according to some embodiments of the present inventive concept.
Figure 12:
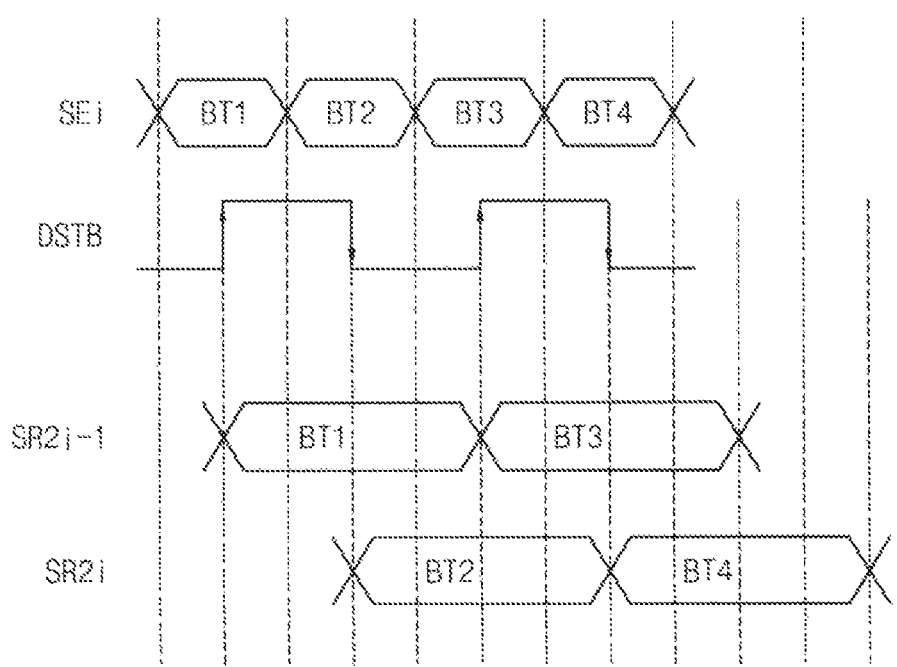
FIG. 12 is a timing diagram illustrating operation of the parallelization unit of FIG. 11, according to some embodiments of the present inventive concept.

FIG. 11 is a circuit diagram illustrating an example embodiment of a parallelization unit included in a reception circuit of a stacked semiconductor device according to example embodiments, and FIG. 12 is a timing diagram illustrating an operation of the parallelization unit of FIG. 11.

Referring to FIGS. 11 and 12, each parallelization unit 351 included in the parallelization circuit DES may include a rising edge triggered flip-flop FF_R and a falling edge triggered flip-flop FF_F. The rising edge triggered flip-flop FF_R may include a data terminal D connected to an input node NI receiving each serial signal SEi among the plurality of serial signals, a clock terminal CK receiving a parallelization strobe signal DSTB and an output terminal Q connected to a first output node NO1 generating a first reception signal SR2i-1 among the plurality of reception signals. The falling edge triggered flip-flop FF_F may include a data terminal D connected to the input node NI receiving the each serial signal SEi, a clock terminal CK receiving the parallelization strobe signal DSTB and an output terminal Q connected to the second output terminal NO2 generating a second reception signal SR2i among the plurality of reception signals.

As illustrated in FIG. 12, data bits BT1, BT2, BT3 and BT4 of the serial signal SEi may be sampled alternately in synchronization with the rising and falling edges of the parallelization strobe signal DSTB. As a result, the data bits BT1 and BT3 may be sampled by the rising edges of the parallelization strobe signal DSTB to be provided as the first reception signal SR2i-1 and the data bits BT2 and BT4 may be sampled by the falling edges of the parallelization strobe signal DSTB to be provided as the second reception signal SR2i.

Figure 13A:
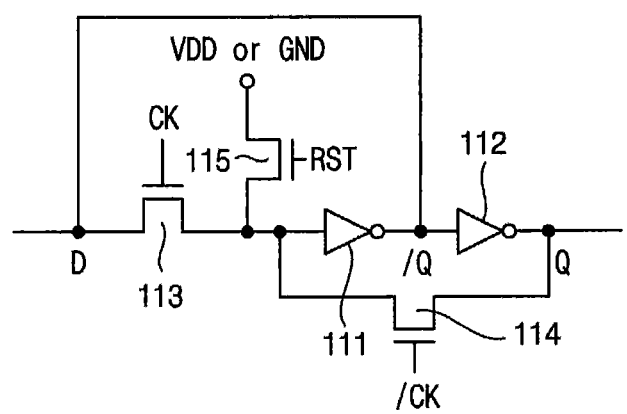
FIGS. 13A and 13B are diagrams illustrating example embodiments of flip-flops included in the parallelization units of FIGS. 9 and 11, according to some embodiments of the present inventive concept.
Figure 13B:
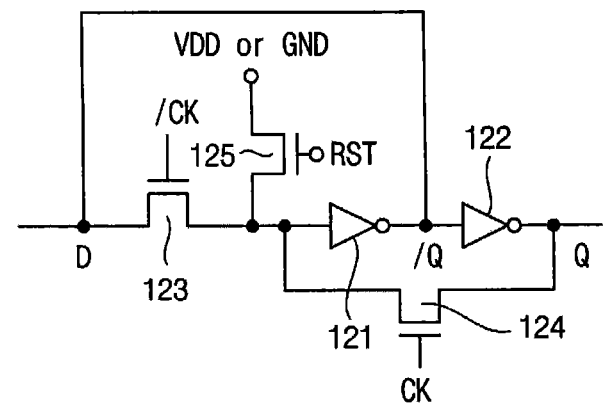

FIGS. 13A and 13B are diagrams illustrating example embodiments of flip-flops included in the parallelization units of FIGS. 9 and 11.

FIG. 13A illustrates an example of a positive-edge triggered flip-flop or a rising edge triggered flip-flop and FIG. 13B illustrates an example of a negative-edge triggered flip-flop or a falling-edge triggered flip-flop. The non-limiting example configuration of the flip-flops in FIGS. 13A and 13B are presented for describing the toggling operation of the flip-flops included in the parallelization unit, and the configuration of the flip-flops may be changed according to various embodiments.

Referring to FIG. 13A, the positive-edge triggered flip-flop may include a first inverter 111, a second inverter 112, a first switch 113 and a second switch 114.

The output of the first inverter 111 is coupled to the input of the second inverter 112, and the output of the second inverter 112 is coupled to the input of the first inverter 111 via the second switch 114, thereby forming a latch configuration. In the example of FIG. 13A, the output of the first inverter 111 corresponds to an inversion output terminal /Q and the output of the second inverter 112 corresponds to a non-inversion output terminal Q. The first switch 113 is coupled between a data terminal D and the input of the first inverter 111 and the control terminal CK of the first switch 113 corresponds to a clock terminal. A clock signal CLK is applied to the control terminal CK of the first switch 113 and an inversion signal /CLK of the clock signal CLK is applied to the control terminal /CK of the second switch 114. The positive-edge triggered flip-flop of FIG. 13A may further include a reset switch 115 for initializing a state of the flip-flop.

When the clock signal CLK applied to the control terminal CK is logic low, the flip-flop of FIG. 13A is in a storage state that does not change even though the logic level of the data terminal D is changed. When the clock signal CLK transitions from logic low to logic high, that is, at the rising edge of the clock signal CLK, the logic level of the data terminal D is transferred into the non-inversion output terminal Q. The flip-flop such that the logic state is determined in synchronization with the edge of the signal applied to the clock terminal CK is referred to as an edge triggered flip-flop, and the flip-flop of FIG. 13A corresponds to a positive-edge triggered flip-flop.

Referring to FIG. 13B, the negative-edge triggered flip-flop may include a first inverter 121, a second inverter 122, a first switch 123, a second switch 124 and a reset switch 125. The negative-edge triggered flip-flop of FIG. 13B has a configuration similar to the positive-edge triggered flip-flop of FIG. 13A, but the inversion signal /CLK of the clock signal CLK is applied to the control gate /CK of the first switch 123 and the clock signal CLK is applied to the control gate CK of the second switch 124. That is, the flip-flops of FIGS. 7 and 8 are different in that the control terminals CK and /CK are exchanged.

The negative-edge triggered flip-flop of FIG. 13B performs toggling in response to the falling edges of the clock signal CLK whereas the positive-edge triggered flip-flop of FIG. 13A performs toggling in response to the rising edges of the clock signal CLK. As such, the negative-edge triggered flip-flop performs toggling by inverting the storage state from logic high to logic low or from logic low to logic high at each falling edge of the clock signal CLK applied to the control terminal CK.

The parallelization unit as described above may include such positive-edge triggered flip-flops and/or negative-edge triggered flip-flops as described with reference to FIGS. 13A and 13B.

Figure 14:
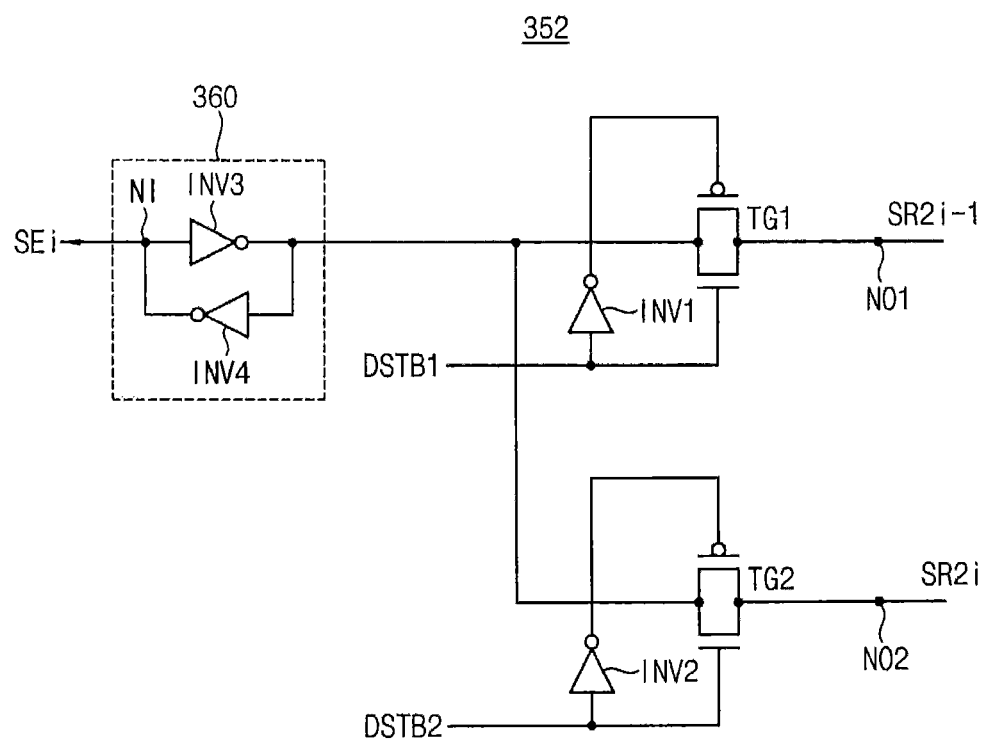
FIG. 14 is a circuit diagram illustrating example embodiment of a parallelization unit included in a reception circuit of a stacked semiconductor device, according to some embodiments of the present inventive concept.
Figure 15:
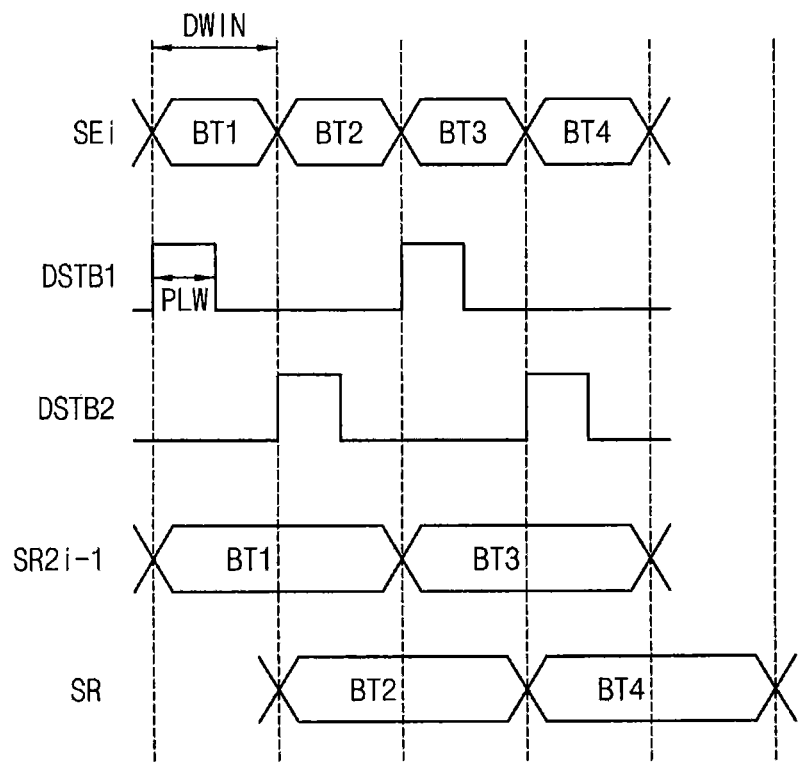
FIG. 15 is a timing diagram illustrating operation of the parallelization unit of FIG. 14, according to some embodiments of the present inventive concept.

FIG. 14 is a circuit diagram illustrating an example embodiment of a parallelization unit included in a reception circuit of a stacked semiconductor device according to example embodiments, and FIG. 15 is a timing diagram illustrating an operation of the parallelization unit of FIG. 14.

Referring to FIGS. 14 and 15, each parallelization unit 352 included in the parallelization circuit DES of FIG. 6 may include a first transmission gate TG1 and a second transmission gate TG2. The first transmission gate TG1 may be connected between an input node NI receiving each serial signal SEi among the plurality of serial signals and a first output node NO1 generating a first reception signal SR2i-1 among the plurality of reception signals. The second transmission gate TG2 may be connected between the input node NI and a second output node NO2 generating a second reception signal SR2i among the plurality of reception signals. Each parallelization unit 352 may further include inverters INV1 and INV2 to invert the parallelization strobe signals DSTB1 and DSTB2 and an input circuit 360 to buffer the serial signal SEi of the input node NI. For example, the input circuit 360 may be implemented with a latch of two inverters INV3 and INV4. The input circuit 360 may be the above-described reception buffer BF or may be a portion of the reception buffer.

The first transmission gate TG1 may be turned on during an activation time of a first parallelization strobe signal DSTB1 and the second transmission gate TG2 may be turned on an activation time of a second parallelization strobe signal DSTB2 having a phase different from a phase of the first parallelization strobe signal DSTB1. As illustrated in FIG. 15, The first and second parallelization strobe signals DSTB1 and DSTB2 may be pulse signals having pulses of relatively short pulse widths.

The first and second The first and second serialization strobe signals DSTB1 and DSTB2 may be activated alternately and thus the first and second transmission gates TG1 and TG2 may alternately sample data bits BT1, BT2, BT3 and BT4 of the serial signal SEi. As a result, the data bits BT1 and BT3 may be sampled by the first parallelization strobe signal DSTB1 to be provided as the first reception signal SR2$i$-1 and the data bits BT2 and BT4 may be sampled by the second parallelization strobe signal DSTB2 to be provided as the second reception signal SR2$i$.

FIGS. 14 and 15 illustrate a non-limiting example of the parallelization unit including the two transmission gates, and it would be understood easily that the parallelization unit may include three or more transmission gates. According to example embodiments, each of the M parallelization units may include N transmission gates configured to sample each of the M serial signals in response to N parallelization strobe signals having different phases, respectively, to generate N reception signals among the P reception signals.

The pulse width PLW of the parallelization strobe signals DSTB1 and DSTB2 may be set properly depending on operation characteristics of the transmission gates included in the parallelization unit. To prevent sampling errors, the pulse width PLW of the parallelization strobe signals DSTB1 and DSTB2 may be shorter than a duration time DWIN of one data bit of the serial signal SEi.

Example embodiments are described with reference to FIGS. 6 through 15 such that two data signals are transferred using one data path. In some example embodiments, three or more data signals may be transferred using one data path. For example, as will be described with reference to FIGS. 16A and 16B, four data signals may be transferred using one data path by performing the serialization and parallelization using four strobe signals having different phases.

Figure 16A:
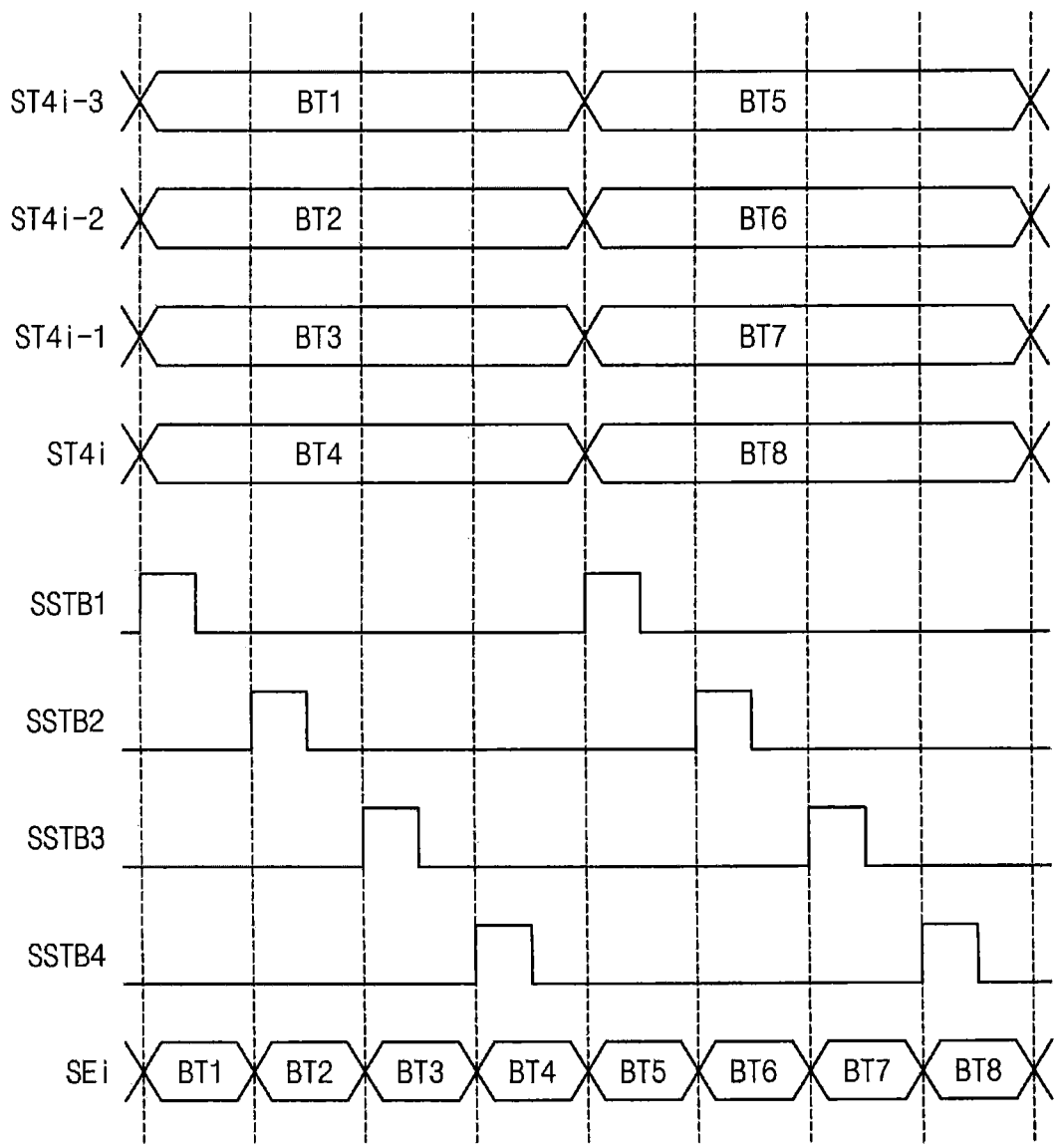
FIGS. 16A and 16B are timing diagrams illustrating a method of transferring signals in a stacked semiconductor device, according to some embodiments of the present inventive concept.
Figure 16B:
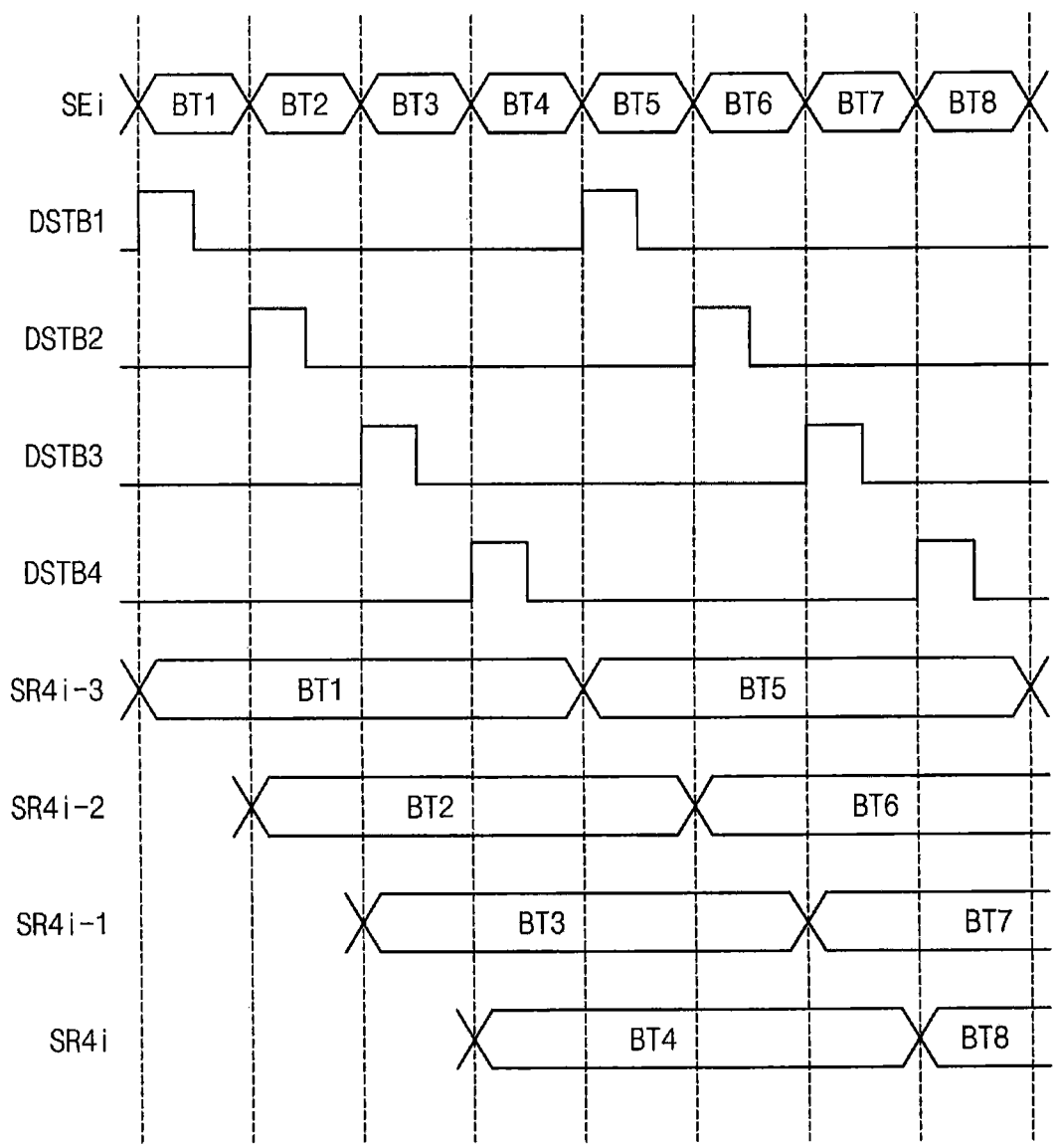

FIGS. 16A and 16B are timing diagrams illustrating a method of transferring signals in a stacked semiconductor device according to example embodiments.

Referring to FIG. 16A, first through fourth serialization strobe signals SSTB1~SSTB4 may be activated alternately. Even though not illustrated in figures, four transmission gates included in each serialization unit may transfer the first through fourth transmission signals ST4$i$-3, ST4$i$-2, ST4$i$-1 and ST4$i$ alternately to an output node NO, that is in each data path DPTHi. As a result, the data bits BT1 and BT5 of the first transmission signal ST4$i$-3, the data bits BT2 and BT6 of the second transmission signal ST4$i$-2, the data bits BT3 and BT7 of the third transmission signal ST4$i$-1 and the data bits BT4 and BT8 of the fourth transmission signal ST4$i$ may be sampled alternately to generate the serial signal SEi.

Referring to FIG. 16B, first through fourth parallelization strobe signals DSTB1~DSTB4 may be activated alternately. Even though not illustrated in figures, four transmission gates or four flip-flops included in each parallelization unit may sample alternately the data bits BT1~BT8 of the serial signal SEi. As a result, the data bits BT1 and BT5 may be sampled by the first parallelization strobe signal DSTB1 to provide the first reception signal SR4$i$-3, the data bits BT2 and BT6 may be sampled by the second parallelization strobe signal DSTB2 to provide the second reception signal SR4$i$-2, the data bits BT3 and BT7 may be sampled by the third parallelization strobe signal DSTB3 to provide the third reception signal SR4$i$-1, and the data bits BT4 and BT8 may be sampled by the fourth parallelization strobe signal DSTB4 to provide the fourth reception signal SR4$i$.

Figure 17:
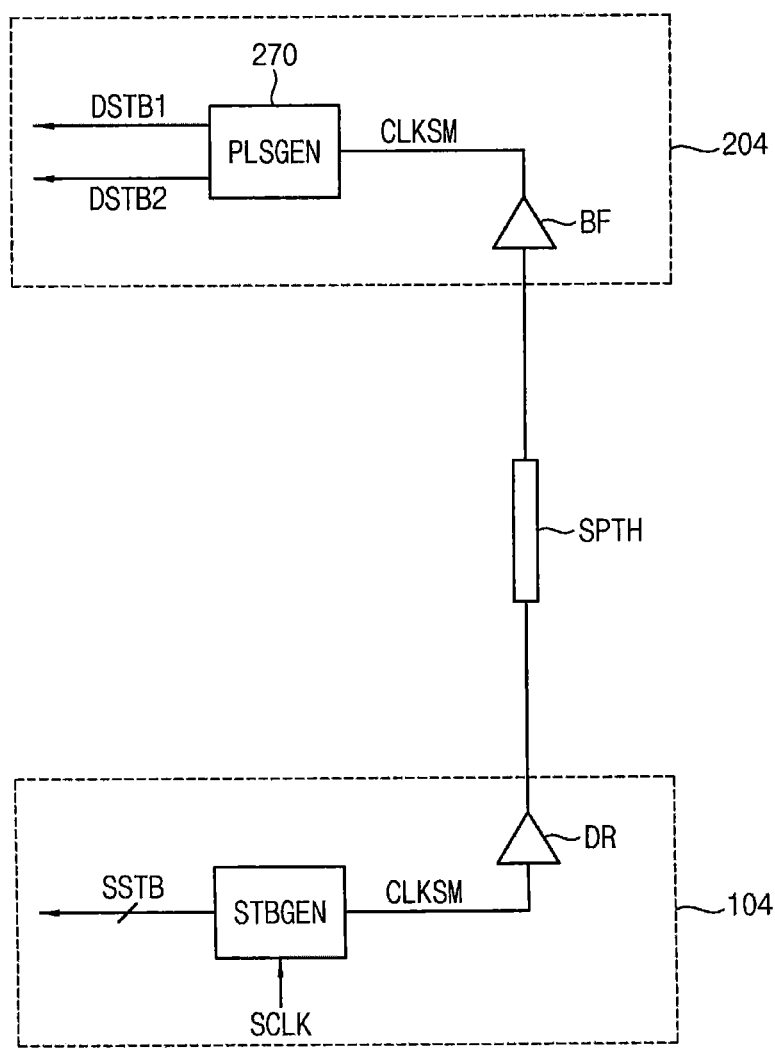
FIG. 17 is a diagram illustrating a stacked semiconductor device according to some embodiments of the present inventive concept.

FIG. 17 is a diagram illustrating a stacked semiconductor device according to example embodiments.

Referring to FIG. 17, a stacked semiconductor device 14 includes a transmission circuit 104, at least one strobe path SPTH and a reception circuit 204. As described above, the transmission circuit 104 and the reception circuit 204 may be included in the transceiver circuits TRX1, TRX2 and TRX3 in FIGS. 2 and 3, respectively. For convenience of illustration, above-described serialization circuit SER, parallelization circuit DES and data paths DPTH are omitted in FIG. 17.

The transmission circuit 104 may include a strobe generation circuit STBGEN configured to generate one or more serialization strobe signals SSTB and at least one sampling clock signal CLKSM. The serialization strobe signals SSTB may be provide to the serialization circuit SER and the sampling clock signal CLKSM may be output to the strobe path SPTH.

The reception circuit 204 may include a pulse generation circuit PLSGEN configured to receive the sampling clock signal CLKSM from the strobe path SPTH and generate the one or more parallelization strobe signals DSTB1 and DSTB2 synchronized with rising edges and falling edges of the sampling clock signals CLKSM. As such, the number of the through-silicon vias for transferring strobe signals by transferring one strobe sampling clock signal and generating the two parallelization strobe signals in the reception circuit 204 is reduced.

Figure 18:
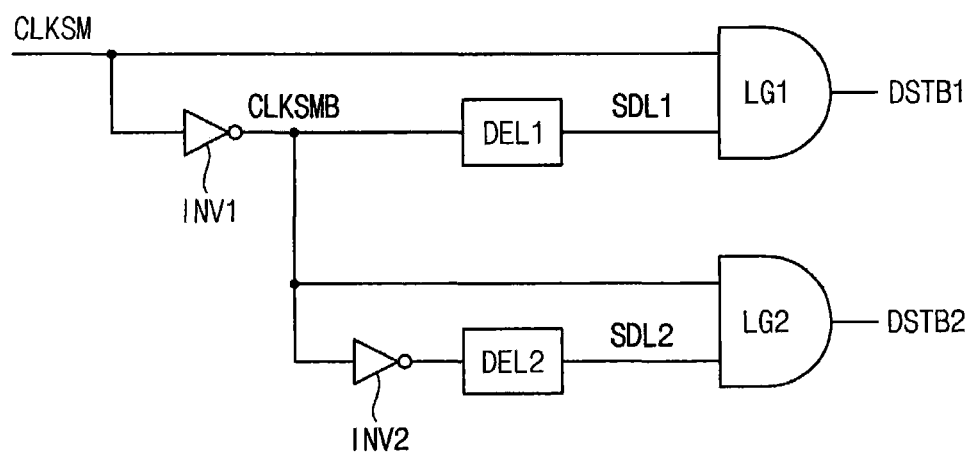
FIG. 18 is a diagram illustrating an example embodiment of a pulse generation circuit included in the stacked semiconductor device of FIG. 17, according to some embodiments of the present inventive concept.
Figure 19:
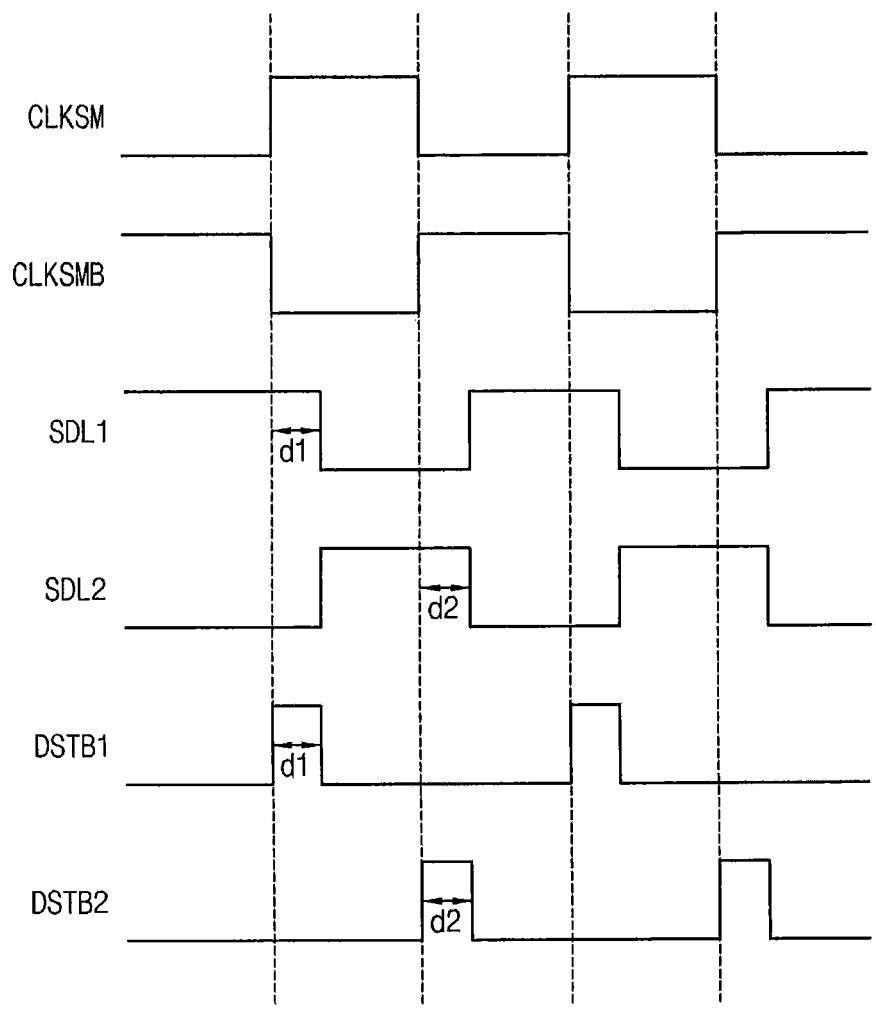
FIG. 19 is a timing diagram illustrating operation of the pulse generation circuit of FIG. 18, according to some embodiments of the present inventive concept.

FIG. 18 is a diagram illustrating an example embodiment of a pulse generation circuit included in the stacked semiconductor device of FIG. 17, and FIG. 19 is a timing diagram illustrating an operation of the pulse generation circuit of FIG. 18.

Referring to FIG. 18, a pulse generation circuit 270 may include first and second inverters INV1 and INV2, first and second delay circuits DEL1 and DEL2, and first and second logic gates LG1 and LG2. An inverted sampling clock signal CLKSMB, a first delay signal SDL1 and a second delay signal SDL2 as illustrated in FIG. 19 may be generated using the first and second inverters INV1 and INV2, and the first and second delay circuits DEL1 and DEL2. The first delay circuit DEL1 may have a first delay amount d1 and the second delay circuit DEL2 may have a second delay amount d2.

The first and second logic gates LG1 and LG2 may be implemented with AND gates in some embodiments. The first logic gate LG1 may perform an AND logic operation on the sampling clock signal CLKSM and the first delay signal SDL1 to generate the first parallelization strobe signal DSTB1. The second logic gate LG2 may perform an AND logic operation on the inverted sampling clock signal CLKSMB and the second delay signal SDL2 to generate the second parallelization strobe signal DSTB2. As a result, using the rising edges and the falling edges of the on sampling clock signal CLKSM, the two parallelization strobe signals DSTB1 and DSTB2 having different phases may be generated.

Figure 20:
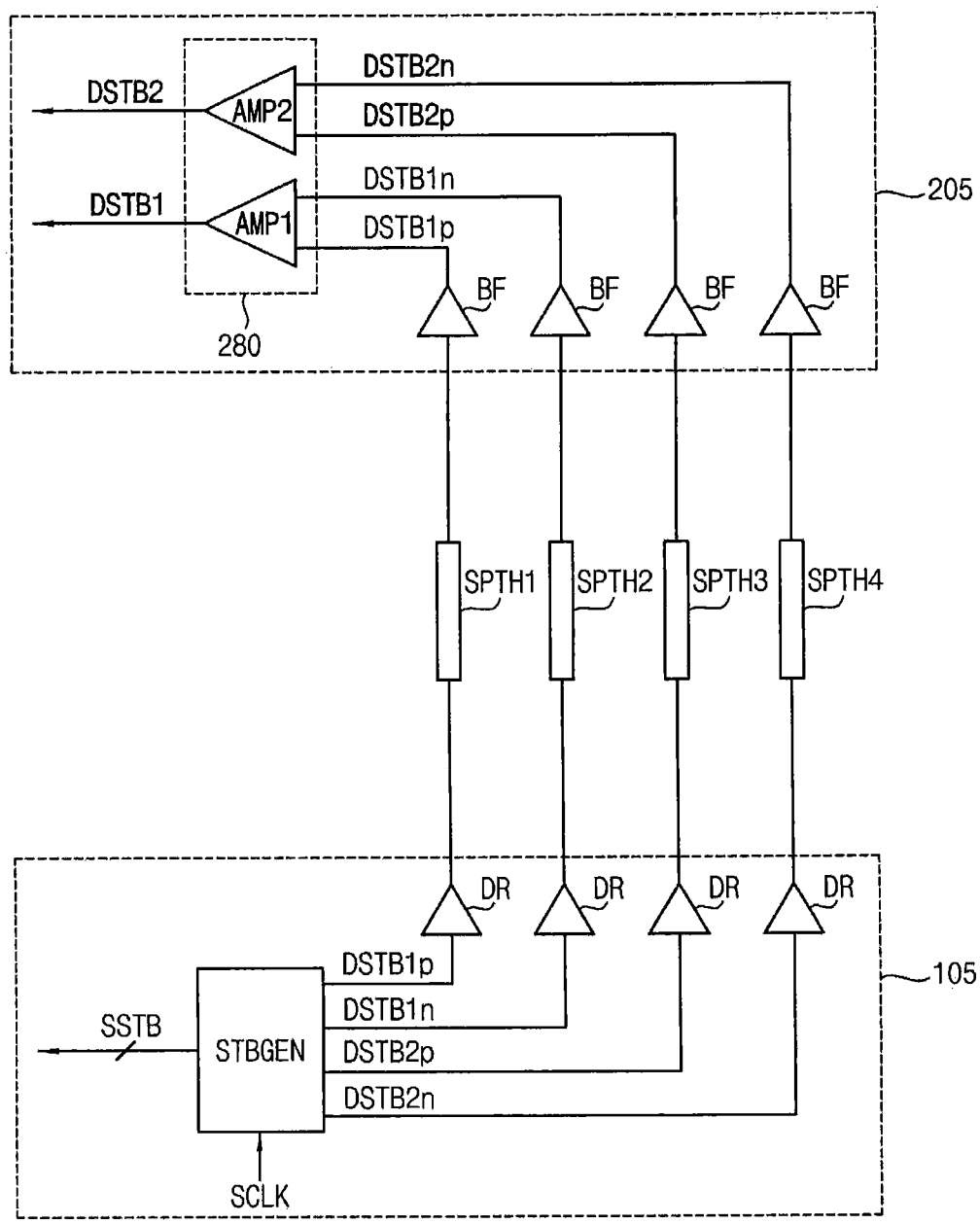
FIG. 20 is a diagram illustrating a stacked semiconductor device, according to some embodiments of the present inventive concept.
Figure 21:
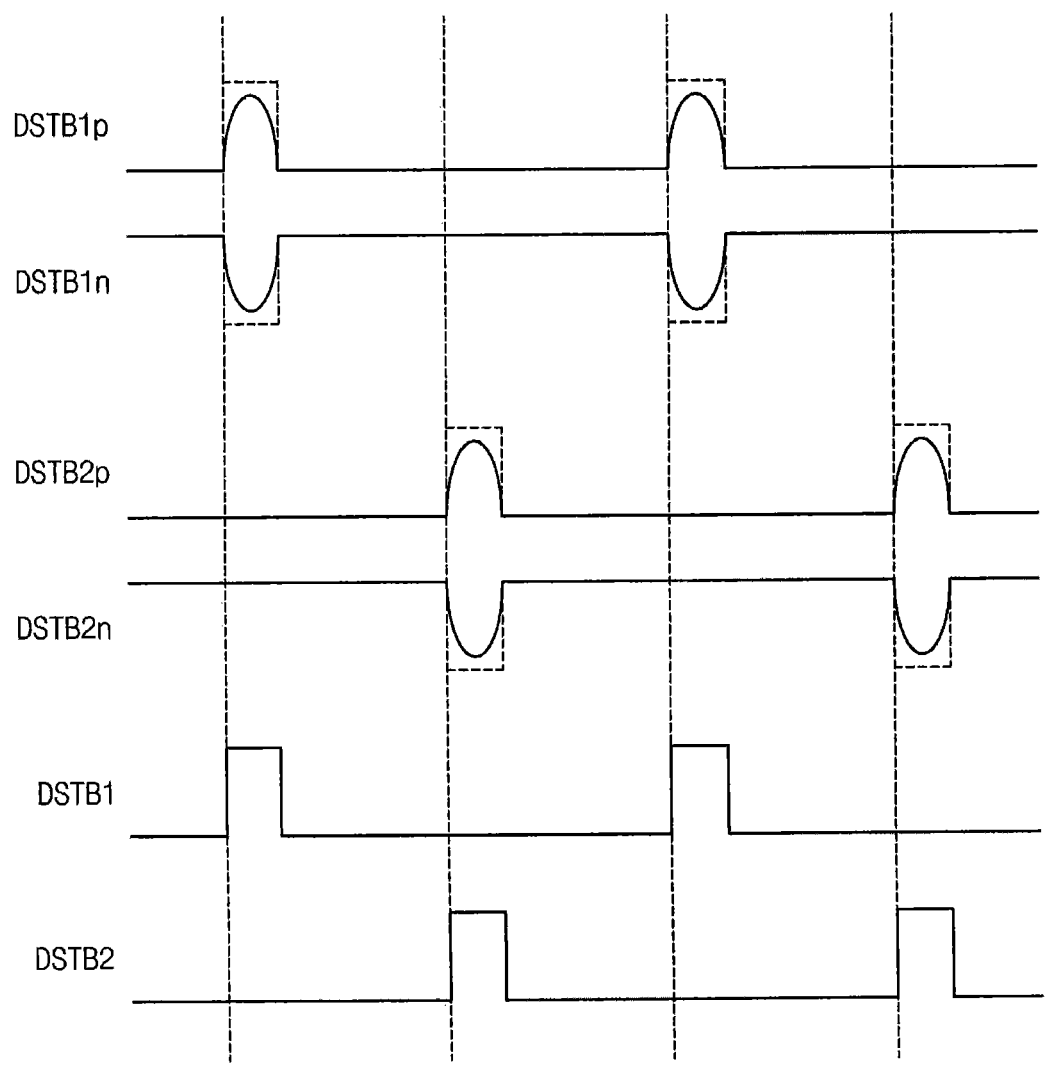
FIG. 21 is a timing diagram illustrating operation of a differential amplifier included in the stacked semiconductor device of FIG. 20, according to some embodiments of the present inventive concept.

FIG. 20 is a diagram illustrating a stacked semiconductor device according to example embodiments, and FIG. 21 is a timing diagram illustrating an operation of a differential amplifier included in the stacked semiconductor device of FIG. 20.

Referring to FIGS. 20 and 21, a stacked semiconductor device 15 includes a transmission circuit 105, strobe paths SPTH1~SPTH4 and a reception circuit 205. The transmission circuit 105 and the reception circuit 205 may be included in the transceiver circuits TRX1, TRX2 and TRX3 in FIGS. 2 and 3, respectively. For convenience of illustration, above-described serialization circuit SER, parallelization circuit DES and data paths DPTH are omitted in FIG. 20.

The transmission circuit 105 may include a strobe generation circuit STBGEN configured to generate one or more serialization strobe signals SSTB and one or more strobe differential signal pairs, for example, a first strobe differential signal pair DSTB1p and DSTB1n and a second strobe differential signal pair DSTB2p and DSTB2n. The serialization strobe signals SSTB may be provided to the serialization circuit SER and the first strobe differential signal pair DSTB1p and DSTB1n and the second strobe differential signal pair DSTB2p and DSTB2n may be output to the strobe paths SPTH1~SPTH4.

The reception circuit 205 may include a differential amplification circuit 280 configured to receive the strobe differential signal pairs from the strobe paths and generate the parallelization strobe signals based on the strobe differential signal pairs. For example, as illustrated in FIG. 20, the differential amplification circuit 280 may include a first differential amplifier AMP1 configured to generate the first parallelization strobe signal DSTB1 based on the first strobe differential signal pair DSTB1p and DSTB1n and the second differential amplifier AMP2 configured to generate the second parallelization strobe signal DSPB2 based on the second strobe differential signal pair DSTB2p and DSTB2n.

In the first strobe differential signal pair DSTB1p and DSTB1n and the second strobe differential signal pair DSTB2p and DSTB2n of FIG. 21, the pulses of dotted lines represent example waveforms output from the transmission circuit 105 and the pulses of solid lines represent example waveforms received by the reception circuit 205. As such, the strobe signals may be attenuated through the strobe paths SPTH1~SPTH4 and thus the strobe signals may not transferred properly. Accordingly, as illustrated in FIGS. 20 and 21, two strobe signals, that is, one strobe signal pair may be transferred through two strobe paths and the strobe signal pair may be differential-amplified in the reception circuit to generate one parallelization strobe signal, thereby enhancing reliability of the parallelization strobe signal.

Figure 22:
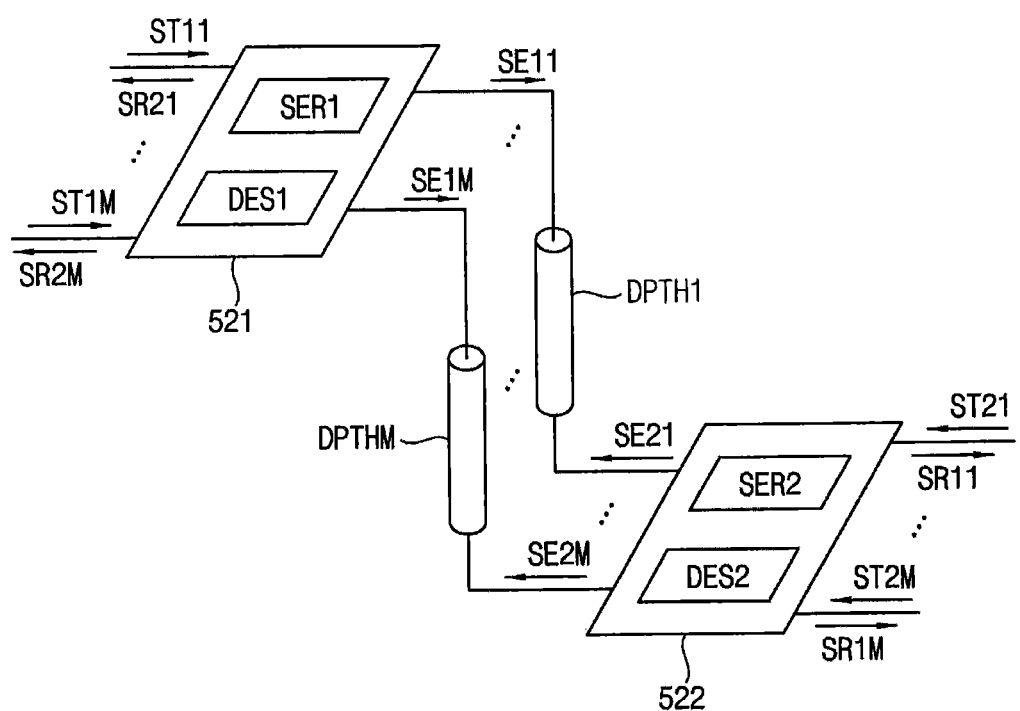
FIGS. 22 and 23 are diagrams illustrating a stacked semiconductor device, according to some embodiments of the present inventive concept.
Figure 23:
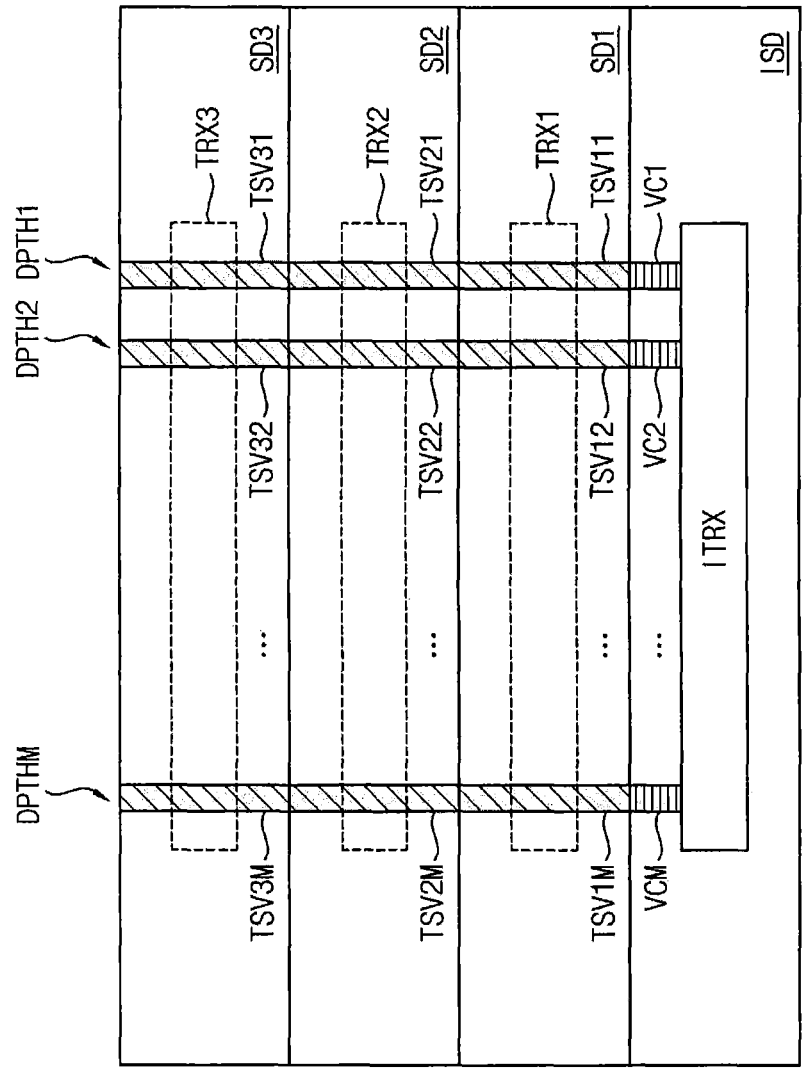

FIGS. 22 and 23 are diagrams illustrating a stacked semiconductor device according to example embodiments.

Referring to FIG. 22, a stacked semiconductor device 16 includes a first transceiver circuit 521, a second transceiver circuit 522, and data paths DPTH1~DPTHM there between. The first transceiver circuit 521 may include a first serialization circuit SER1 and a first parallelization circuit DES1 for bi-directional communication. Also the second transceiver circuit 522 may include a second serialization circuit SER1 and a second parallelization circuit DES2 for bi-directional communication.

The first transceiver circuit 521 and the second transceiver circuit 522 may correspond to the transceiver circuits TRX1, TRX2 and TRX3 in FIGS. 2 and 3, respectively. For example, to perform an interlayer signal transfer, the first transceiver circuit 521 may be included in one of the semiconductor dies SD1, SD2 and SD3 and the second transceiver circuit 522 may be included in a different one of the semiconductor dies SD1, SD2 and SD3. As described above with reference to FIGS. 2 and 3, each of the data paths DPTH1~DPTHM may include at least one through-substrate via for the signal transfer between the semiconductor dies SD1, SD2 and SD3.

In case of the signal transfer from the first transceiver circuit 521 to the second transceiver circuit 522, the first transceiver circuit 521 serializes transmission signals ST11~ST1M to generates serial signals SE11~SE1M using the first serialization circuit SER1. The second transceiver circuit 522 parallelizes the serial signals SE11~SE1M received from the data paths DPTH1~DPTH2 to reception signals SR11~SR1M corresponding to the transmission signals ST11~ST1M using the second parallelization circuit DES2.

In case of the signal transfer from the second transceiver circuit 522 to the first transceiver circuit 521, the second transceiver circuit 522 serializes transmission signals ST21~ST2M to generates serial signals SE21~SE2M using the second serialization circuit SER2. The first transceiver circuit 521 parallelizes the serial signals SE21~SE2M received from the data paths DPTH1~DPTH2 to reception signals SR21~SR2M corresponding to the transmission signals ST21~ST2M using the first parallelization circuit DES1.

Referring to FIG. 23, a stacked semiconductor device 17 includes an interface semiconductor die ISD and a plurality of semiconductor dies SD1, SD2 and SD3 that are stacked on the interface semiconductor die ISD in a first direction such as a vertical direction. FIG. 23 illustrates a non-limiting example of the three stacked semiconductor dies SD1, SD2 and SD3, and the number of the stacked semiconductor dies may be determined in various ways. In some example embodiments, the semiconductor dies SD1, SD2 and SD3 may be memory semiconductor dies in which memory cells are integrated and the interface semiconductor die ISD may be an interposer for connecting the semiconductor dies SD1, SD2 and SD3 and an external controller.

The semiconductor dies SD1, SD2 and SD3 may include internal circuits (not shown), transceiver circuits TRX1, TRX2 and TRX3 and through-silicon vias or through-substrate vias TSV11~TSV1M, TSV21~TSV2M and TSV31~TSV3M, respectively. The interface semiconductor die ISD may include an internal circuit (not shown), vertical contacts VC1 and VC2 and a transceiver circuit ITRX. In some embodiments, the through-silicon vias or through-substrate vias TSV11~TSV1M, TSV21~TSV2M and TSV31~TSV3M may not extend through each of the semiconductor dies SD1, SD2, and/or SD3, but extend through a subset of the semiconductor dies SD1, SD2 and/or SD3.

Each of data paths DPTH1 and DPTH2 includes one or more through-substrate vias that are formed in the semiconductor dies SD1, SD2 and SD3, respectively. For example, as illustrated in FIG. 23, the first data path DPTH1 may include the three through-substrate vias TSV11, TSV21 and TSV31 respectively formed in the three semiconductor dies SD1, SD2 and SD3 and the vertical contact VC1 formed in the interface semiconductor die ISD, and the second data path DPTH2 may include the three through-substrate vias TSV21, TSV22 and TSV32 respectively formed in the three semiconductor dies SD1, SD2 and SD3 and the vertical contact VC2 formed in the interface semiconductor die ISD. Even though FIG. 23 illustrates that the two through-substrate vias in the adjacent semiconductor dies are connected directly, the through-substrate vias may be electrically connected through bumps, pads, metal wires, etc.

Each transceiver circuit TRXi (i=, 1, 2, 3) and ITRX may serialize a plurality of transmission signals from the corresponding internal circuit to output the serial signals to the data paths DPTH1~DPTHM. In addition, each transceiver circuit TRXi and ITRX may parallelize the serial signals from the data paths DPTH1~DPTHM to provide the reception signals corresponding the transmission signals to the corresponding internal circuit. Such signal transfer may be similar to the description with reference to FIGS. 4 through 22.

Figure 24:
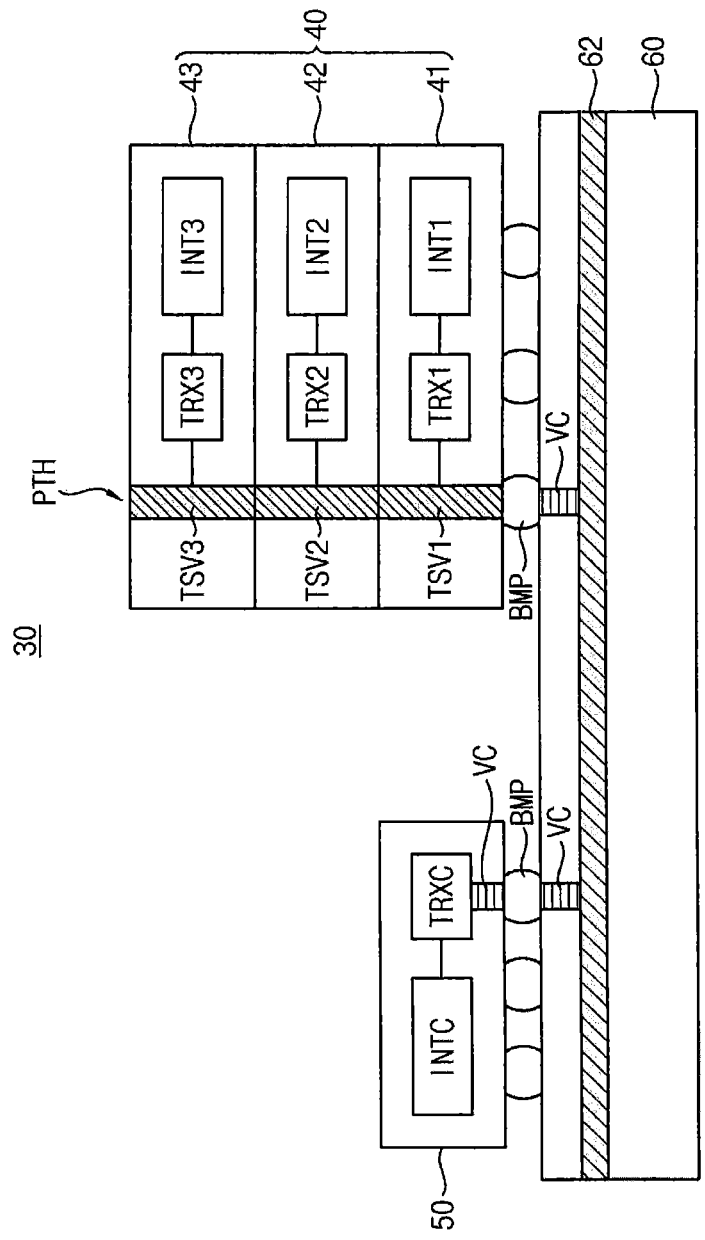
FIG. 24 is a diagram illustrating a system including a stacked semiconductor device, according to some embodiments of the present inventive concept.

FIG. 24 is a diagram illustrating a system including a stacked semiconductor device according to example embodiments.

Referring to FIG. 24, a system 30 includes a base substrate 60 and a plurality of semiconductor dies 41, 42, 43 and 50 that are stacked on the base substrate 60. The stacked semiconductor dies 41, 42 and 43 may be packaged as a chip 40 and the semiconductor die 50 may be packaged as another separate chip. The packaged chips 40 and 50 may be mounted on the base substrate 60 using the bumps BMP, and may be electrically connected to each other through the bumps BMP, the vertical contacts VC and/or the signal lines 62 of the base substrate 60.

The stacked semiconductor chip 40 includes the plurality of semiconductor dies 41, 42 and 43 that are stacked in a first direction, such as a vertical direction. FIG. 24 illustrates a non-limiting example of the three stacked semiconductor dies 41, 42 and 43, and the number of the stacked semiconductor dies in the stacked semiconductor chip 40 may vary. The semiconductor dies 41, 42 and 43 may include internal circuits INT1, INT2 and INT3, transceiver circuits TRX1, TRX2 and TRX3 and through-silicon vias or through-substrate vias TSV1, TSV2 and TSV3, respectively. The other semiconductor die 50 may include an internal circuit INTC, a transceiver circuit TRXC and/or vertical contacts VC.

Each data path PTH may include the through-substrate vias TSV1, TSV2 and TSV3 formed in the semiconductor dies 41, 42 and 43, respectively. Even though FIG. 24 illustrates that the two through-substrate vias in the adjacent semiconductor dies are connected directly, the through-substrate vias may be electrically connected to one another through bumps, pads, metal wires, etc.

Each transceiver circuit TRXi (i=, 1, 2, 3) and TRXC may serialize the transmission signals from the internal circuit INTi and INTC to the serial signals and output the serial signals to the data paths PTH. In addition, each transceiver circuit TRXi and TRXC may parallelize the serial signals from the data paths PTH to the reception signals corresponding the transmission signals and provide the reception signals to the internal circuit INTi and INTC. Such signal transfer is similar to that described with reference to FIGS. 4 through 22.

The internal circuit INTi and INTC may include various integrated circuits according to the kind of the semiconductor chips 40 and 50. For example, the stacked semiconductor chip 40 may be a memory device and the other semiconductor chip 50 may be a memory controller. In this case, memory cells and circuits for operating the memory cells may be integrated in the internal circuits INT1, INT2 and INT3 of the semiconductor memory chip 40. The semiconductor dies 41, 42 and 43 may be homogeneous or heterogeneous.

Figure 25:
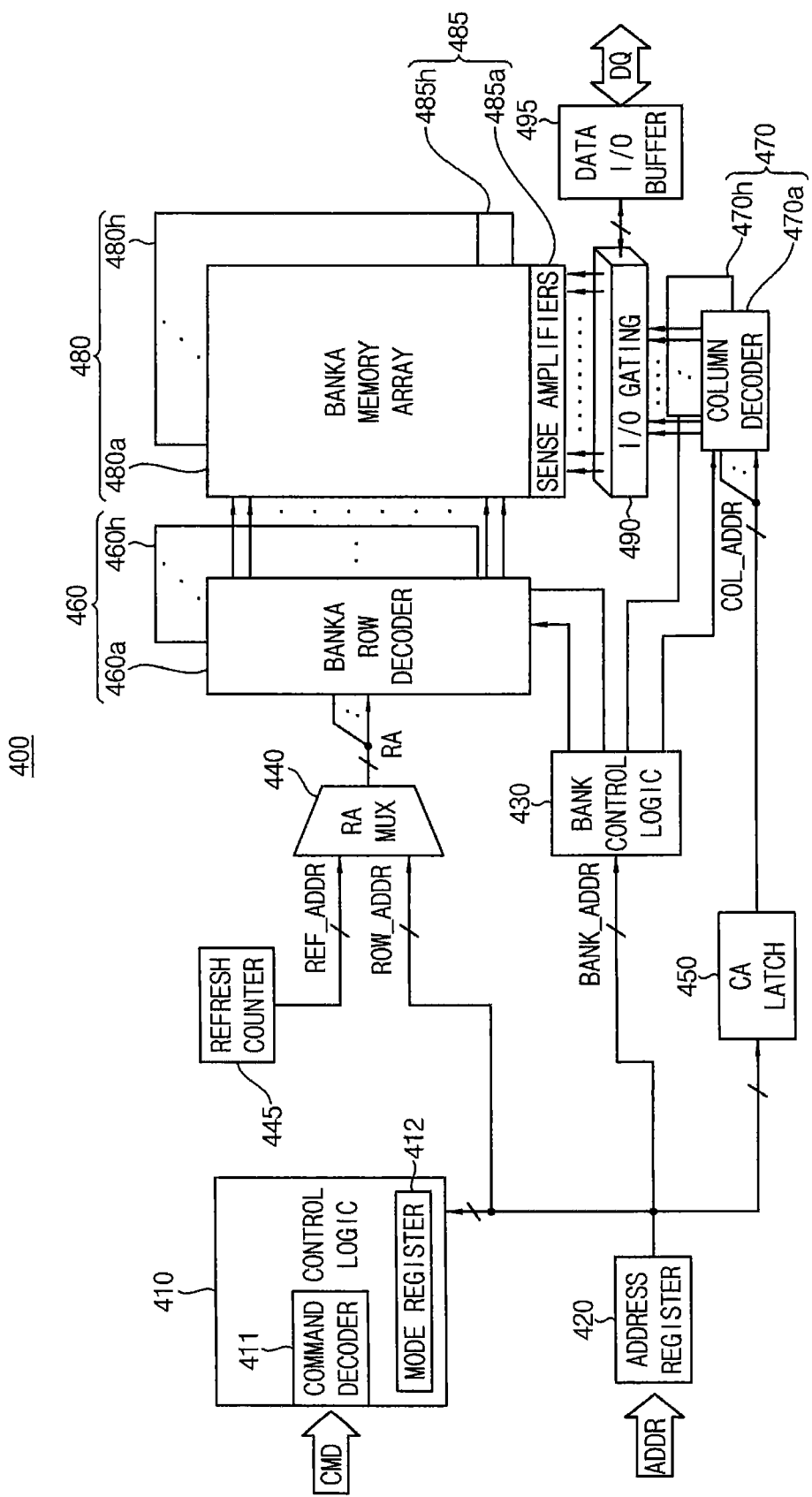
FIG. 25 is a diagram illustrating an example of an internal circuit formed in a semiconductor die, according to some embodiments of the present inventive concept.

FIG. 25 is a diagram illustrating an example of an internal circuit formed in a semiconductor die.

Referring to FIG. 25, an internal circuit 400 may correspond to a memory region or a memory device. The memory region 400 (or, alternatively, the memory device) may include a control logic 410, an address register 420, a bank control logic 430, a row address multiplexer 440, a column address latch 450, a row decoder 460, a column decoder 470, a memory cell array 480, a sense amplifier unit 485, an input/output (I/O) gating circuit 490, a data input/output (I/O) buffer 495, and a refresh counter 445.

The memory cell array 480 may include a plurality of bank arrays 480a~480h. The row decoder 460 may include a plurality of bank row decoders 460a~460h respectively coupled to the bank arrays 480a~480h, the column decoder 470 may include a plurality of bank column decoders 470a~470h respectively coupled to the bank arrays 480a~480h, and the sense amplifier unit 485 may include a plurality of bank sense amplifiers 485a~485h respectively coupled to the bank arrays 480a~480h.

The address register 420 may receive an address ADDR including a bank address BANK_ADDR, a row address ROW_ADDR and/or a column address COL_ADDR from the memory controller. The address register 420 may provide the received bank address BANK_ADDR to the bank control logic 430, may provide the received row address ROW_ADDR to the row address multiplexer 440, and may provide the received column address COL_ADDR to the column address latch 450.

The bank control logic 430 may generate bank control signals in response to the bank address BANK_ADDR. One of the bank row decoders 460a~460h corresponding to the bank address BANK_ADDR may be activated in response to the bank control signals, and one of the bank column decoders 470a~470h corresponding to the bank address BANK_ADDR may be activated in response to the bank control signals.

The row address multiplexer 440 may receive the row address ROW_ADDR from the address register 420, and may receive a refresh row address REF_ADDR from the refresh counter 445. The row address multiplexer 440 may selectively output the row address ROW_ADDR or the refresh row address REF_ADDR as a row address RA. The row address RA that is output from the row address multiplexer 440 may be applied to the bank row decoders 460a~460h.

The activated one of the bank row decoders 460a~460h may decode the row address RA that is output from the row address multiplexer 440, and may activate a word-line corresponding to the row address RA. For example, the activated bank row decoder may apply a word-line driving voltage to the word-line corresponding to the row address RA.

The column address latch 450 may receive the column address COL_ADDR from the address register 420, and may temporarily store the received column address COL_ADDR. In some embodiments, in a burst mode, the column address latch 450 may generate column addresses that increment from the received column address COL_ADDR. The column address latch 450 may apply the temporarily stored or generated column address to the bank column decoders 470a~470h.

The activated one of the bank column decoders 470a~470h may decode the column address COL_ADDR that is output from the column address latch 450, and may control the input/output gating circuit 490 in order to output data corresponding to the column address COL_ADDR.

The I/O gating circuit 490 may include a circuitry for gating input/output data. The I/O gating circuit 490 may further include read data latches for storing data that is output from the bank arrays 480a~480h, and write drivers for writing data to the bank arrays 480a~480h.

Data to be read from one bank array of the bank arrays 480a~480h may be sensed by the sense amplifier 485 coupled to the one bank array from which the data is to be read, and may be stored in the read data latches. The data stored in the read data latches may be provided to the memory controller via the data I/O buffer 495. Data DQ to be written in one bank array of the bank arrays 480a~480h may be provided to the data I/O buffer 495 from the memory controller. The write driver may write the data DQ in one bank array of the bank arrays 480a~480h.

The control logic 410 may control operations of the memory region 400. For example, the control logic 410 may generate control signals for the memory region 400 in order to perform a write operation or a read operation. The control logic 410 may include a command decoder 411 that decodes a command CMD received from the memory controller and a mode register set 412 that sets an operation mode of the memory region 400.

For example, the command decoder 411 may generate the control signals corresponding to the command CMD by decoding a write enable signal, a row address strobe signal, a column address strobe signal, a chip selection signal, etc.

Figure 26:
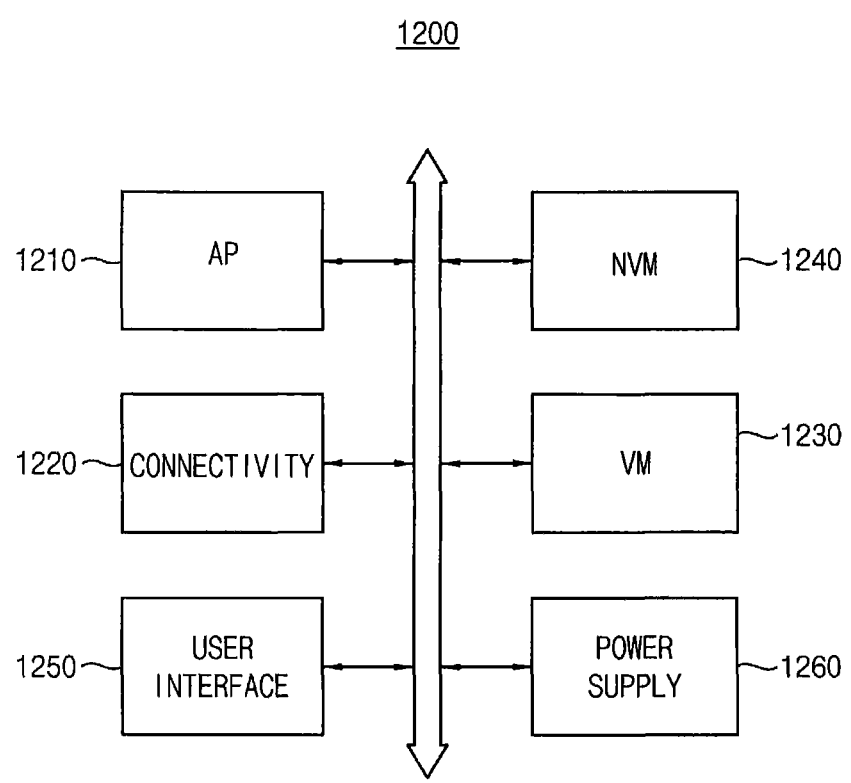
FIG. 26 is a block diagram illustrating a mobile system, according to some embodiments of the present inventive concept.

FIG. 26 is a block diagram illustrating a mobile system according to example embodiments.

Referring to FIG. 26, a mobile system 1200 includes an application processor 1210, a connectivity unit 1220, a volatile memory device (VM) 1230, a nonvolatile memory device (NVM) 1240, a user interface 1250, and a power supply 1260.

The application processor 1210 may execute applications such as a web browser, a game application, a video player, etc. The connectivity unit 1220 may perform wired or wireless communication with an external device. The volatile memory device 1230 may store data processed by the application processor 1210, or may operate as a working memory. The nonvolatile memory device 1240 may store a boot image for booting the mobile system 1200. The user interface 1250 may include at least one input device, such as a keypad, a touch screen, etc., and at least one output device, such as a speaker, a display device, etc. The power supply 1260 may supply a power supply voltage to the mobile system 1200.

The volatile memory device 1230 and/or the nonvolatile memory device 1240 may be implemented with the stacked structure as described with reference to FIGS. 1 through 25, which includes the serialization circuit, the parallelization circuit and the data paths electrically connecting them.

As described above, the stacked semiconductor device, the system and the method of transferring signals according to example embodiments may reduce the sizes of the stacked semiconductor device and the system by serializing the transmission signals, transferring the serialized signals through the smaller number of data paths between the stacked semiconductor dies and then parallelizing the transferred signals, to reduce the number of through-silicon vias in the stacked semiconductor device.

The example embodiments of the inventive concepts may be applied to any devices and systems including a stacked structure of semiconductor dies. For example, the present inventive concept may be applied to systems such as be a mobile phone, a smart phone, a personal digital assistant (PDA), a portable multimedia player (PMP), a digital camera, a camcorder, personal computer (PC), a server computer, a workstation, a laptop computer, a digital TV, a set-top box, a portable game console, a navigation system, etc.

As used herein, the term "and/or" includes any and all combinations of one or more of the associated listed item. Expressions such as "at least one of," when preceding a list of elements, modify the entire list of elements and do not modify the individual elements of the list.

The foregoing is illustrative of example embodiments and is not to be construed as limiting thereof. Although a few example embodiments have been described, those skilled in the art will readily appreciate that many modifications are possible in the example embodiments without materially departing from the example embodiments of the inventive concepts.

What is claimed is:

1. A stacked semiconductor device comprising:
   a plurality of semiconductor dies in the stacked semiconductor device stacked in a first direction;
   M data paths electrically connecting two of the plurality of semiconductor dies, one data path of the M data paths comprising one or more through-silicon vias, wherein M is a positive integer;
   a transmission circuit comprising M serialization units configured to serialize P transmission signals to M serial signals and output the M serial signals to the M data paths, respectively, wherein P is a positive integer greater than M; and
   a reception circuit comprising M parallelization units configured to receive the M serial signals from the M data paths and parallelize the M serial signals to P reception signals corresponding to the P transmission signals,
   wherein one of the M serialization units comprises N transmission gates configured to transfer N transmission signals among the P transmission signals in a round-robin order to each of the M data paths in response to N serialization strobe signals having different phases, respectively.

2. The stacked semiconductor device of claim 1, wherein one of the M parallelization units comprises:
   N flip-flops configured to sample respective ones of the M serial signals in response to N parallelization strobe signals having different phases, respectively, to generate N reception signals corresponding to the N flip-flops among the P reception signals.

3. The stacked semiconductor device of claim 1, wherein the N transmission gates comprise N first transmission gates, and wherein one of the M parallelization units comprises:
   N second transmission gates configured to sample a respective one of the M serial signals in response to N parallelization strobe signals having different phases, respectively, to generate corresponding N reception signals among the P reception signals.

4. The stacked semiconductor device of claim 3,
   wherein a pulse width of one of the N parallelization strobe signals corresponds to a duration time of one data bit of the M serial signals, and
   wherein the pulse width of the one of the N parallelization strobe signals is shorter than the duration time of the one data bit of the M serial signals.

5. The stacked semiconductor device of claim 1, further comprising:
   one or more strobe paths electrically connecting the plurality of semiconductor dies, each of the one or more strobe paths comprising one or more through-silicon vias, wherein one of the M parallelization units parallelizes a respective one of the M serial signals to corresponding ones of the P reception signals in response to one or more parallelization strobe signals transferred through the one or more strobe paths.

6. The stacked semiconductor device of claim 5, wherein the transmission circuit further comprises:
   a strobe generation circuit configured to generate the one or more parallelization strobe signals based on a source clock signal to output the one or more parallelization strobe signals to the one or more strobe paths.

7. The stacked semiconductor device of claim 6, wherein the strobe generation circuit is further configured to generate one or more serialization strobe signals synchronized with corresponding ones of the one or more parallelization strobe signals based on the source clock signal, and
   wherein one of the M serialization units serializes a corresponding one of the P transmission signals to a corresponding one of the M serial signals in response to the one or more serialization strobe signals.

8. The stacked semiconductor device of claim 5, wherein the transmission circuit further comprises a strobe generation circuit configured to generate one or more sampling clock signals to output the one or more sampling clock signals to the one or more strobe paths, and
   wherein the reception circuit further comprises a pulse generation circuit configured to receive the one or more sampling clock signals from the one or more strobe paths and generate the one or more parallelization strobe signals synchronized with rising edges and/or falling edges of the one or more sampling clock signals.

9. The stacked semiconductor device of claim 5, wherein the transmission circuit further comprises a strobe generation circuit configured to generate one or more strobe differential signal pairs to output the one or more strobe differential signal pairs to the one or more strobe paths, and
   wherein the reception circuit further comprises a differential amplification circuit configured to receive the one or more strobe differential signal pairs from the one or more strobe paths and generate the one or more parallelization strobe signals based on the one or more strobe differential signal pairs.

10. The stacked semiconductor device of claim 1, wherein one of the M serialization units serializes N transmission signals among the P transmission signals to generate a corresponding one of the M serial signals, and
    wherein one of the M parallelization units parallelizes a corresponding one of the M serial signals to generate N reception signals among the P reception signals.

11. The stacked semiconductor device of claim 1, wherein the one of the M serialization units comprises:
    a first transmission gate of the N transmission gates connected between a first input node receiving a first transmission signal among the P transmission signals and an output node connected to one of the M data paths, the first transmission gate configured to be turned on during an activation time of a first serialization strobe signal of the N serialization strobe signals; and
    a second transmission gate of the N transmission gates connected between a second input node receiving a second transmission signal among the P transmission signals and the output node, the second transmission gate configured to be turned on during an activation time of a second serialization strobe signal of the N serialization strobe signals having a phase different from a phase of the first serialization strobe signal.

12. The stacked semiconductor device of claim 1, wherein one of the M parallelization units comprises:
    a first flip-flop comprising a data terminal receiving a serial signal among the M serial signals, a clock terminal receiving a first parallelization strobe signal, and an output terminal generating a first reception signal among the P reception signals; and
    a second flip-flop comprising a data terminal receiving the serial signal, a clock terminal receiving a second parallelization strobe signal having a second phase different from a first phase of the first parallelization strobe signal, and an output terminal generating a second reception signal among the P reception signals.

13. The stacked semiconductor device of claim 1, wherein one of the M parallelization units comprises:
    a rising edge triggered flip-flop comprising a data terminal receiving a serial signal among the M serial signals, a clock terminal receiving a parallelization strobe signal, and an output terminal generating a first reception signal among the P reception signals; and
    a falling edge triggered flip-flop comprising a data terminal receiving the serial signal, a clock terminal receiving the parallelization strobe signal, and an output terminal generating a second reception signal among the P reception signals.

14. The stacked semiconductor device of claim 1, wherein one of the M parallelization units comprises:
    a first transmission gate connected between an input node receiving a serial signal among the M serial signals and a first output node generating a first reception signal among the P reception signals, the first transmission gate configured to be turned on during an activation time of a first parallelization strobe signal; and
    a second transmission gate connected between the input node and a second output node generating a second reception signal among the P reception signals, the second transmission gate configured to be turned on during an activation time of a second parallelization strobe signal having a second phase different from a first phase of the first parallelization strobe signal.

15. The stacked semiconductor device of claim 1, wherein the transmission circuit is included in a first semiconductor die among the plurality of semiconductor dies, and the reception circuit is included in a second semiconductor die among the plurality of semiconductor dies.

16. A system comprising:
    a base substrate;
    a plurality of semiconductor dies stacked on the base substrate in a first direction; and
    a plurality of data paths electrically connecting the plurality of semiconductor dies, one data path of the plurality of data paths comprising one or more through-silicon vias,
    wherein the system is configured to serialize a plurality of transmission signals to a plurality of serial signals to output the plurality of serial signals to the plurality of data paths, respectively, in a first semiconductor die among the plurality of semiconductor dies,
    wherein a number of the plurality of transmission signals is greater than a number of the plurality of data paths,
    wherein the system is configured to parallelize the plurality of serial signals received from the plurality of data paths to a plurality of reception signals corresponding to the plurality of transmission signals in a second semiconductor die among the plurality of semiconductor dies, and wherein the system comprises a plurality of flip-flops configured to sample respective ones of the plurality of serial signals in response to respective ones of a plurality of parallelization strobe signals having different phases, to generate the plurality of reception signals corresponding to the plurality of flip-flops among the plurality of reception signals.

17. The system of claim 16, further comprising:
one or more strobe paths electrically connecting the plurality of semiconductor dies, each of the one or more strobe paths comprising a respective one of the one or more through-silicon vias,
wherein the plurality of parallelization strobe signals used to parallelize the plurality of serial signals to the plurality of reception signals are provided from the first semiconductor die to the second semiconductor die through the one or more strobe paths.

18. A method of transferring signals in a stacked semiconductor device, the method comprising:
stacking a plurality of semiconductor dies in a first direction;
electrically connecting the plurality of semiconductor dies through M data paths, at least one data path of the M data paths comprising a through-silicon via, wherein M is a positive integer;
serializing P transmission signals to M serial signals in a first semiconductor die among the plurality of semiconductor dies to output the M serial signals to the M data paths, respectively, wherein P is a positive integer greater than M; and
parallelizing the M serial signals received from the M data paths to P reception signals corresponding to the P transmission signals in a second semiconductor die among the plurality of semiconductor dies,
wherein the parallelizing the M serial signals comprises sampling, by N transmission gates, respective ones of the M serial signals in response to N parallelization strobe signals having different phases, respectively, to generate corresponding N reception signals among the P reception signals.

19. The method of claim 18, wherein the through-silicon via comprises a first through-silicon via, the method further comprising:
electrically connecting the plurality of semiconductor dies through one or more strobe paths, at least one of the one or more strobe paths comprising a second through-silicon via; and
providing a plurality of parallelization strobe signals of the N parallelization strobe signals used to parallelize the plurality of M serial signals to the plurality of P reception signals from the first semiconductor die to the second semiconductor die through the one or more strobe paths.

* * * * *